(12) United States Patent
Park et al.

(10) Patent No.: US 8,207,590 B2
(45) Date of Patent: Jun. 26, 2012

(54) IMAGE SENSOR, SUBSTRATE FOR THE SAME, IMAGE SENSING DEVICE INCLUDING THE IMAGE SENSOR, AND ASSOCIATED METHODS

(75) Inventors: Byung-Jun Park, Yongin-si (KR); Sang-Hee Kim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 208 days.

(21) Appl. No.: 12/458,014

(22) Filed: Jun. 29, 2009

(65) Prior Publication Data

US 2010/0006969 A1 Jan. 14, 2010

(30) Foreign Application Priority Data

Jul. 3, 2008 (KR) .................. 10-2008-0064204
Oct. 29, 2008 (KR) .................. 10-2008-0106530

(51) Int. Cl.
*H01L 31/05* (2006.01)
(52) U.S. Cl. ........... 257/444; 257/E23.141; 257/E21.51; 438/98
(58) Field of Classification Search .................. 257/444, 257/E21.51, E23.141; 438/98
See application file for complete search history.

(56) References Cited

U.S. PATENT DOCUMENTS

| | | | |
|---|---|---|---|
| 5,374,564 A | 12/1994 | Bruel | |
| 5,994,207 A | 11/1999 | Henley et al. | |
| 6,020,252 A | 2/2000 | Aspar et al. | |
| 6,221,740 B1 | 4/2001 | Bryan et al. | |
| 6,225,192 B1 | 5/2001 | Aspar et al. | |
| 6,391,740 B1 | 5/2002 | Cheung et al. | |
| 6,476,374 B1 * | 11/2002 | Kozlowski et al. | 250/214.1 |
| 6,645,828 B1 | 11/2003 | Farrens et al. | |
| 6,809,009 B2 | 10/2004 | Aspar et al. | |
| 7,238,583 B2 | 7/2007 | Swain et al. | |
| 7,709,872 B2 * | 5/2010 | Shiau et al. | 257/294 |
| 7,884,436 B2 * | 2/2011 | Mabuchi | 257/432 |
| 7,956,392 B2 * | 6/2011 | Uya | 257/292 |
| 2007/0117254 A1 | 5/2007 | Pain | |
| 2007/0194397 A1 | 8/2007 | Adkisson et al. | |

OTHER PUBLICATIONS

Iwabuchi, Shin, et al., "A Back-Illuminated High-Sensitivity Small-Pixel Color CMOS Image Sensor with Flexible Layout of Metal Wiring", ISSCC 2006 / Session 16 / MEMS and Sensors / 16.8—2006 IEEE International Solid-State Circuits Conference, (8 pages) (Feb. 7, 2006).

Joy, Tom, et al., "Development of Production-Ready, Back-Illuminated CMOS Image Sensor with Small Pixels", Electron Devices Meeting, 2007, IEDM 2007, pp. 1007-1010, IEEE International Publication Date: Dec. 10-12, 2007.

* cited by examiner

*Primary Examiner* — Allan R Wilson
(74) *Attorney, Agent, or Firm* — Lee & Morse, P.C.

(57) ABSTRACT

A method of fabricating a CMOS image sensor includes forming a substrate structure that includes a first substrate, a second substrate, and an index matching layer containing nitrogen and an oxide layer between the first and second substrates, and, forming at least one light-sensing device in the second substrate, and after forming the substrate structure, forming a metal interconnection structure on a first surface of the second substrate, the first surface facing away from the first substrate, such that the at least one light sensing device is between the metal interconnection structure and the index matching layer and the oxide layer, the metal interconnection structure being electrically connected to the at least one light-sensing device.

27 Claims, 28 Drawing Sheets

IMAGE SENSOR, SUBSTRATE FOR THE SAME, IMAGE SENSING DEVICE INCLUDING THE IMAGE SENSOR, AND ASSOCIATED METHODS

BACKGROUND

1. Field

Embodiments relate to an image sensor, a substrate for the same, an image sensing device including the image sensor, and associated methods.

2. Description of the Related Art

An image sensor may be formed as a "front side" CMOS image sensor that includes a plurality of photo diodes in a substrate. After forming the photo diodes, metal wiring patterns may be formed on the photo diodes. The metal wiring patterns may be formed to provide apertures for the photo diodes to receive external light. However, light entering the apertures at an angle may be reflected by the metal wiring patterns. Further, an interlayer dielectric layer surrounding the metal wiring patterns may absorb light incident thereon. Thus, the amount of light reaching the photo diodes through the apertures may be reduced, resulting in poor device sensitivity. Further, light reflected within the image sensor may impinge upon adjacent photo diodes, such that cross-talk between photo diodes occurs. An alternative to the front side image sensor is a back side image sensor. However, current back side image sensor designs and manufacturing processes may suffer from drawbacks such as dark current, lack of light sensitivity, i.e., poor quantum efficiency, and the need to protect heat sensitive structures during manufacturing.

SUMMARY

Embodiments are therefore directed to an image sensor, a substrate for the same, an image sensing device including the image sensor, and associated methods, which substantially overcome one or more of the problems due to the limitations and disadvantages of the related art.

It is therefore a feature of an embodiment to provide an image sensor, a substrate for the same, an image sensing device including the image sensor, and associated methods, in which a dark current is reduced.

It is therefore another feature of an embodiment to provide an image sensor, a substrate for the same, an image sensing device including the image sensor, and associated methods, in which light sensitivity is improved.

It is therefore another feature of an embodiment to provide an image sensor, a substrate for the same, an image sensing device including the image sensor, and associated methods, which provide for the prevention of heat-sensitive structures (or for the formation of the heat-resistant structures) after high-heat processes are employed.

At least one of the above and other features and advantages may be realized by providing a method of fabricating a CMOS image sensor, the method including forming a substrate structure that includes a first substrate, a second substrate, and an index matching layer containing nitrogen and an oxide layer between the first and second substrates, and forming at least one light-sensing device in the second substrate, and after forming the substrate structure, forming a metal interconnection structure on a first surface of the second substrate, the first surface facing away from the first substrate, such that the at least one light sensing device is between the metal interconnection structure and the index matching layer and the oxide layer, the metal interconnection structure being electrically connected to the at least one light-sensing device.

The oxide layer may be formed by thermal oxidation of a second surface of the second substrate opposite the first surface, and the oxide layer may be formed between the index matching layer and the second substrate.

The method may further include forming a shallow implant layer in the second substrate, such that the shallow implant layer is between the bulk of the second substrate and the oxide layer.

Forming the shallow implant layer may include implanting ions of a p-type dopant into the second substrate and thermally activating the implanted ions.

The index matching layer may be formed from a silicon nitride layer, and forming the substrate structure may further include forming a bonding oxide layer on the silicon nitride layer, the bonding oxide layer contacting the first substrate.

Forming the substrate structure may further include, after bonding the first and second substrates together and before forming the at least one light-sensing device, removing a portion of the second substrate so as to thin the second substrate by about 50% or more.

Forming the substrate structure may further include forming a microcavity layer in the second substrate at a predetermined distance from the oxide layer before bonding the first and second substrates together, bonding the first and second substrates together, and removing a portion of the second substrate to a depth of the microcavity layer.

The method may further include, after removing the portion of the second substrate to the depth of the microcavity layer, forming an epitaxial layer on the second substrate, wherein the at least one light sensing device is formed after forming the epitaxial layer.

Forming the substrate structure may further include forming a shallow implant layer in the second substrate after forming the oxide layer and the microcavity layer, the shallow implant layer being formed between the first oxide layer and the microcavity layer.

The index matching layer may be formed from a silicon nitride layer.

The oxide layer and the index matching layer may be form an antireflective layer.

The method may further include forming adjacent light sensing devices in the second substrate, and forming an isolation layer between the adjacent light sensing devices. The isolation structure may be formed to extend from the first surface of the second substrate to a depth sufficient to block optical cross-talk between each of the adjacent light sensing devices.

The method may further include, after forming the metal interconnection structure, reducing a thickness of the first substrate by about 50% or more.

Forming the substrate structure may include forming an etch stop layer between the first substrate and the index matching layer.

The method may further include bonding a third substrate to the first surface of the second substrate after forming the metal interconnection structure and before reducing the thickness of the first substrate by about 50% or more.

At least one of the above and other features and advantages may also be realized by providing a CMOS image sensor, including a substrate having a thermal oxide layer at a second surface thereof, at least one light-sensing device in the substrate, and a metal interconnection structure on a first surface of the substrate, the first surface opposite the second surface, such that the at least one light sensing device is between the metal interconnection structure and the thermal oxide layer, the metal interconnection structure being electrically connected to the at least one light-sensing device.

The CMOS image sensor may further include an index matching layer on the thermal oxide layer, and the thermal oxide layer is contiguous with the second surface of the substrate, such that the thermal oxide layer is between the index matching layer and the at least one light sensing device.

The index matching layer may be a silicon nitride layer, the thermal oxide layer being between the silicon nitride layer and the at least one light-sensing device.

The CMOS image sensor may further include a shallow implant layer in the substrate, the shallow implant layer being between the thermal oxide layer and the bulk of the substrate.

The shallow implant layer may be a boron-containing layer.

The CMOS image sensor may further include an etch stop layer on the thermal oxide layer.

The CMOS image sensor may further include another substrate on the metal interconnection structure, such that the metal interconnection structure is between the substrate and the other substrate.

An oxide layer may be on the metal interconnection structure, an opposing oxide layer may be on the other substrate, and the oxide layer and the opposing oxide layer may directly contact one another.

Adjacent light sensing devices may be in the substrate, an isolation structure may be between the adjacent light-sensing devices, and the isolation structure may extend from the first surface of the substrate to a depth sufficient to block optical cross-talk between each of the adjacent light sensing devices.

The isolation structure may extend from the first surface of the substrate to the thermal oxide layer, and the isolation structure may not pass through the thermal oxide layer.

The index matching layer is a silicon nitride layer, and the isolation structure extends from the first surface and passes through the silicon nitride layer.

At least one of the above and other features and advantages may also be realized by providing a method of fabricating a CMOS image sensor, the method including forming a thermal oxide layer at a second surface of a substrate, forming at least one light-sensing device in the substrate, and forming a metal interconnection structure on a first surface of the substrate, the first surface opposite the second surface, such that the at least one light sensing device is between the metal interconnection structure and the thermal oxide layer, the metal interconnection structure being electrically connected to the at least one light-sensing device.

BRIEF DESCRIPTION OF THE DRAWINGS

The above and other features and advantages will become more apparent to those of ordinary skill in the art by describing in detail example embodiments with reference to the attached drawings, in which:

FIGS. 8C-1, 8C-2, and 8C-3 illustrate examples of the first, second, and third implementations of an image sensor according to the second embodiment;

FIGS. 8E-1, 8E-2 and 8E-3 illustrate additional examples of image sensors according to the second embodiment;

FIGS. 9B-1, 9B-2, and 9B-3 illustrate examples of image sensors that include features of the third embodiment in combination with features of the second embodiment;

DETAILED DESCRIPTION

Figure 1:
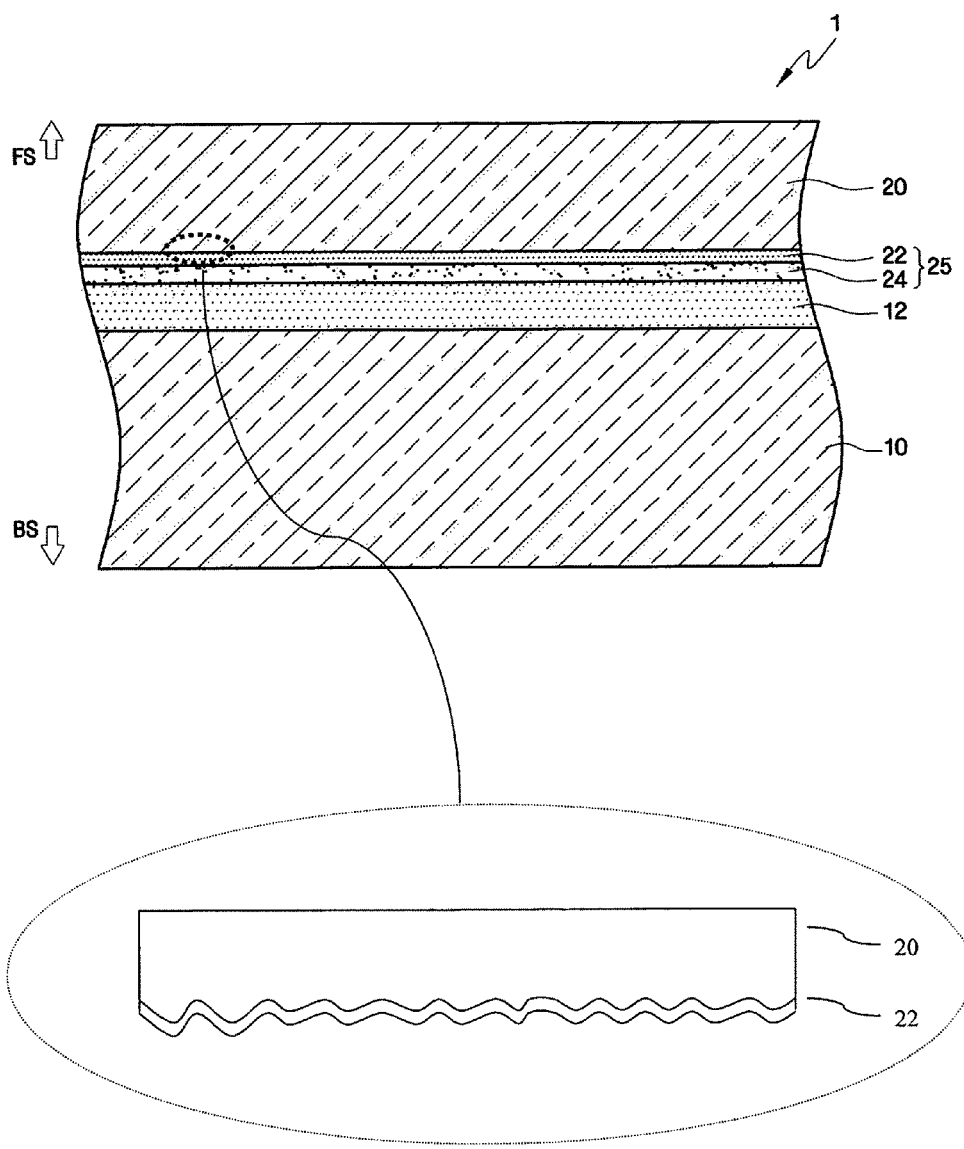
FIGS. 1 to 7 illustrate cross-sectional views of stages in a method of fabricating an image sensor according to a first embodiment.

Korean Patent Application No. 2008-0064204, filed on Jul. 3, 2008, in the Korean Intellectual Property Office, and entitled: "Image Sensor and Fabricating Method Thereof, Device Comprising the Image Sensor and Fabricating Method Thereof, Substrate for Image Sensor and Fabricating Method Thereof," and Korean Patent Application No. 2008-0106530, filed on Oct. 29, 2008, in the Korean Intellectual Property Office, and entitled: "Image sensor and Fabricating Method Thereof," are incorporated by reference herein in their entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

FIGS. 1 to 7 illustrate cross-sectional views of stages in a method of fabricating an image sensor according to a first embodiment. As described in detail below, the stages of fabrication are ordered so as to enable the use of processes having a high heat budget before the formation of heat-sensitive structures. This allows the use of materials and processes that may be more effective at minimizing interface traps and unwanted depletion regions in the resulting image sensor, thereby improving performance of the image sensor.

Referring to FIG. 1, a first substrate 10 and a second substrate 20 may be joined together. As described in detail below, the second substrate 20 may be processed to form a plurality of photo diodes therein, and the first substrate may be partially or completely removed so as to provide a light-sensing area proximate to the photo diodes. Thus, a backside image sensor may be provided.

Further, an oxide layer 22, preferably a thermal oxide, may be disposed between the first substrate 10 and the second substrate 20. The oxide layer 22 may be a high-quality oxide layer that may, according to embodiments described herein, significantly reduce the number of trap sites between the oxide layer 22 and the second substrate 20. As a result, an image sensor according to embodiments may exhibit a reduced dark current.

Figure 20:
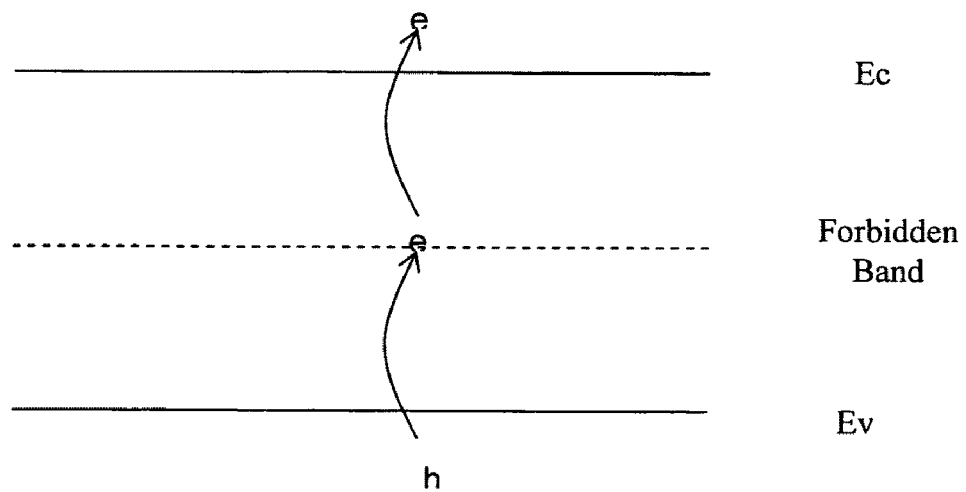
FIG. 20 illustrates a diagram of the effects of trap sites in creating dark current.

The effects of trap sites in creating dark current are illustrated in FIG. 20. Referring to FIG. 20, this forbidden band induced by the trap sites may enable the generation of electron-hole pairs by reducing the energy required to transition between valence and conduction bands (Ev and Ec, respectively). The presence of trap sites may lower the energy barrier of the transition, such that non-light stimuli, e.g., thermal stimuli, mechanical impact, etc., may impart sufficient energy to generate an electron-hole pair. Such non-light-derived electron-hole pairs may manifest themselves as a dark current in the photo diodes, resulting in increased image noise.

Referring again to FIG. 1, the oxide layer 22 may be formed by, e.g., a thermal oxidation process. In an implementation, the thermal oxidation process may be performed at a temperature of more than 400° C. Using a thermal oxidation process to form the oxide layer 22 may improve the characteristics of the interface between the oxide layer 22 and the second substrate 20 so as to reduce trap sites between the oxide layer 22 and the substrate 20, and/or within the oxide layer 22. Using a thermal oxidation process to form the oxide layer 22 may be more effective than using chemical vapor deposition (CVD) at a lower temperature in terms of diminishing dark current and improving light sensitivity by preventing unwanted depletion wells. In this regard, the number of interface traps in a thermal silicon oxide layer may be about 1E10, whereas a number of interface traps in a CVD oxide layer may be about 1E12. Thus, a thermal oxide may have about 100 times fewer interface traps than a CVD oxide.

The first substrate 10 and/or the second substrate 20 may include, e.g., silicon, strained silicon, silicon alloy, silicon carbide, silicon-germanium, silicon-germanium carbide, germanium, a germanium alloy, germanium-arsenic, indium-arsenic, group III-V semiconductors, organic plastic substrates, or a combination thereof. The first and second substrates 10, 20 may be doped, e.g., as p-type or n-type.

The oxide layer 22 may be formed directly on the second substrate 20, preferably by the above-described thermal oxidation process. A etch stop layer 12 may be formed on a surface of the first substrate 10 such that, when the first and second substrates 10, 20 are joined, the etch stop layer 12 is between the first substrate 10 and the oxide layer 22.

The etch stop layer 12 may have an etch rate and/or chemical-mechanical polishing (CMP) removal rate that differs from that of the first substrate 10. The etch stop layer 12 may include, or may be formed entirely of, e.g., oxide, nitride, oxy-nitride, or a combination thereof. The etch stop layer 12 may have a thickness of about 1,000 Å to about 10,000 Å.

An index matching layer 24 may also be disposed between the first and second substrates 10, 20. The index matching layer 24 is a layer with a refractive index between that of a light-transmissive medium, e.g., air, and that of the second substrate 20, e.g., silicon.

The index matching layer 24 may form all or part of an anti-reflective layer 25. The anti-reflective layer 25 may include one or more index matching layers 24 each having a refractive index between that of the light-transmissive medium, e.g., air, and that of the second substrate 20. For example, the anti-reflective layer 25 may include a single index matching layer 24, which may be a nitride layer or an oxynitride layer, or a multi-layer structure of a nitride index matching layer 24 and an oxynitride index matching layer 24. In an implementation, the anti-reflective layer 25 may be considered to include the oxide layer 22 in the case that the oxide layer 22 contributes to the antireflective properties, e.g., where the oxide layer 22 also has a refractive index between that of the light-transmissive medium and the second substrate 20. For example, antireflective layer 25 may include the oxide layer 22, an oxy-nitride index matching layer 24 and a nitride index matching layer 24, stacked in that order on the second substrate 20.

In a particular implementation, the second substrate 20 may be single-crystalline silicon having a refractive index of about 3.5. The anti-reflective layer 25 may include a silicon oxide layer 22, which may have a refractive index of about 1.45 to 1.50, in a stack with a silicon nitride index matching layer 24, which may have a refractive index of about 1.95 to 2.05. The relative refractive indices of the stacked layers may thus prevent light that is incident upon the second substrate 20 through the anti-reflection layer 25 from being reflected off of the second substrate 20, in keeping with Snell's law. Increased levels of incident light may enter the second substrate 20 as a result of the reduction in reflection.

The oxide layer 22 may have a thickness of about 5 Å to about 1,000 Å. The index matching layer 24 may be a nitride layer having a thickness of about 50 Å to about 1,000 Å. The construction of the anti-reflection layer 25 may be altered depending on the nature of light to be detected by the image detector. For example, in the case of an anti-reflection layer 25 that includes a sequential stack of a silicon nitride index matching layer 24 having a thickness of 200 Å, a silicon oxynitride index matching layer 24 having a thickness of 1,500 Å, and a silicon oxide layer 22 having a thickness of 600 Å, light having a wavelength greater than 520 nm may easily penetrate the second substrate 20. As another example, in the case of an anti-reflection layer 25 that includes a sequential stack of a silicon nitride index matching layer 24 having a thickness of 400 Å, a silicon oxynitride index matching layer 24 having a thickness of 80 Å, and a silicon oxide layer 22 having a thickness of 1,600 Å, light having a wavelength between 450 nm and 520 nm may easily penetrate the second substrate 20.

The index matching layer 24 may be formed on the oxide layer 22 that is on the second substrate 20. In another implementation, the index matching layer 24 may be formed on the etch stop layer 12 that is on the first substrate 10. In still another implementation, two opposing index matching layers 24 may be formed, one each on the oxide layer 22 and the etch stop layer 12, and the first and second substrates 10, 20 may be joined by bonding facing surfaces of the opposing index matching layers 24.

Referring to the inset in FIG. 1, in another implementation, reflections may also be reduced by processing the second substrate 20 to have an uneven surface facing the oxide layer 22. The uneven surface may serve to reduce specular reflection. The oxide layer 22 may have an uneven surface where it meets the second substrate 20. The oxide layer 22 may also have an uneven surface at the opposing surface, e.g., in the case that the oxide layer 22 is a conformal layer having a substantially uniform thickness. One or more other layers of the anti-reflective layer 25 may also have uneven surfaces.

The first and second substrates 10, 20 may be bonded together with the etch stop layer 12, the index matching layer 24, and the oxide layer 22 therebetween. Bonding may be achieved by, e.g., plasma activation and direct bonding of the facing surfaces.

Figure 2:
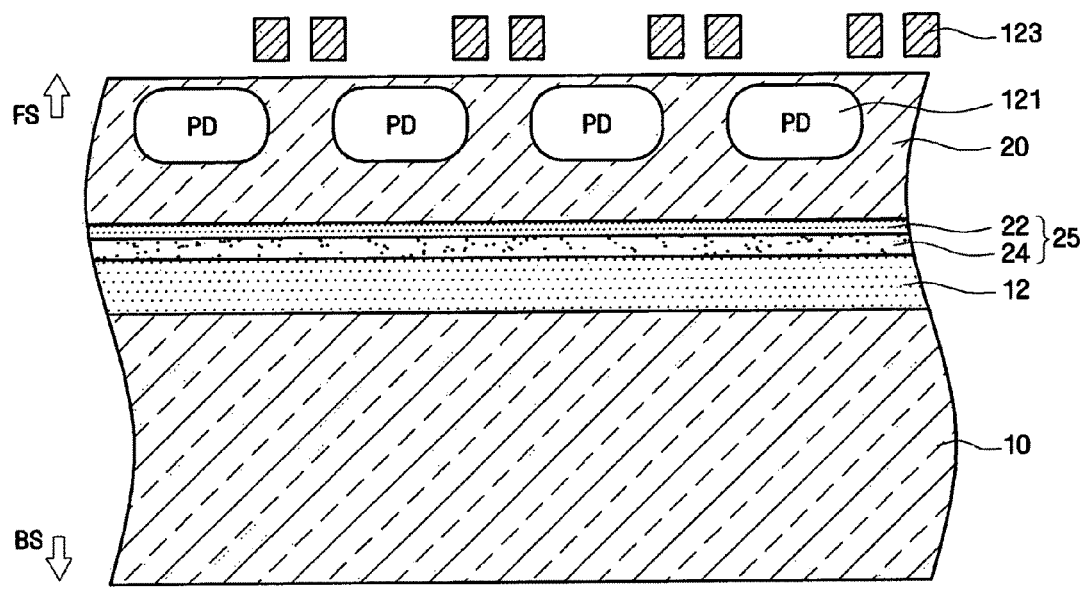

Referring to FIG. 2, one or more light sensing devices 121 may be formed at a surface (denominated in FIG. 2 as a front surface FS) of the second substrate 20 opposite to the surface facing the first substrate 10. In an implementation, the light sensing devices 121 may be formed in the second substrate 20. The light sensing devices 121 may include, e.g., a photo diode PD, a photo transistor, a photo gate, a pinned photo diode, or a combination thereof. A plurality of gate patterns 123 may be arranged at the surface FS of the second substrate 20, e.g., in and/or on the surface FS. The gate patterns 123 may form parts of, e.g., a charge transfer gate, a reset gate, a drive gate, etc.

Figure 3:
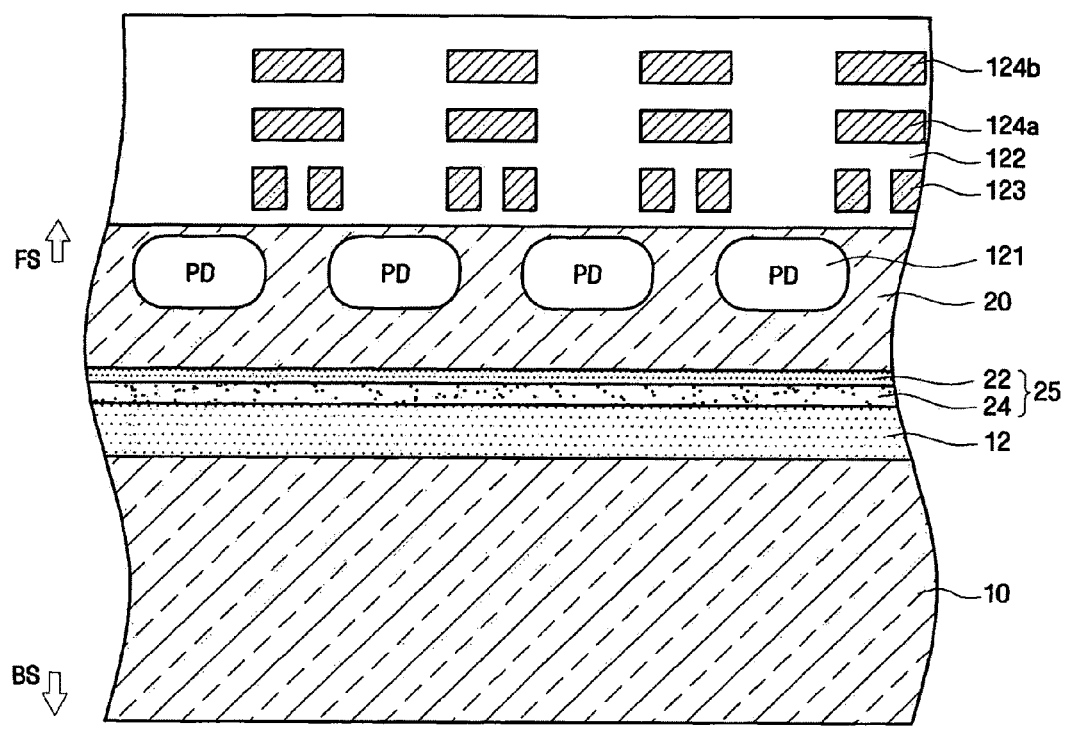

Referring to FIG. 3, metal interconnection patterns 124a, 124b may be formed at the surface FS. The metal interconnection patterns 124a, 124b may be fabricated in one or more interlayer dielectric layers 122. The metal interconnection patterns 124a, 124b may be formed of aluminum, copper, etc. The metal interconnection patterns 124a, 124b may be formed using a single damascene process, a dual damascene process, etc.

Figure 4:
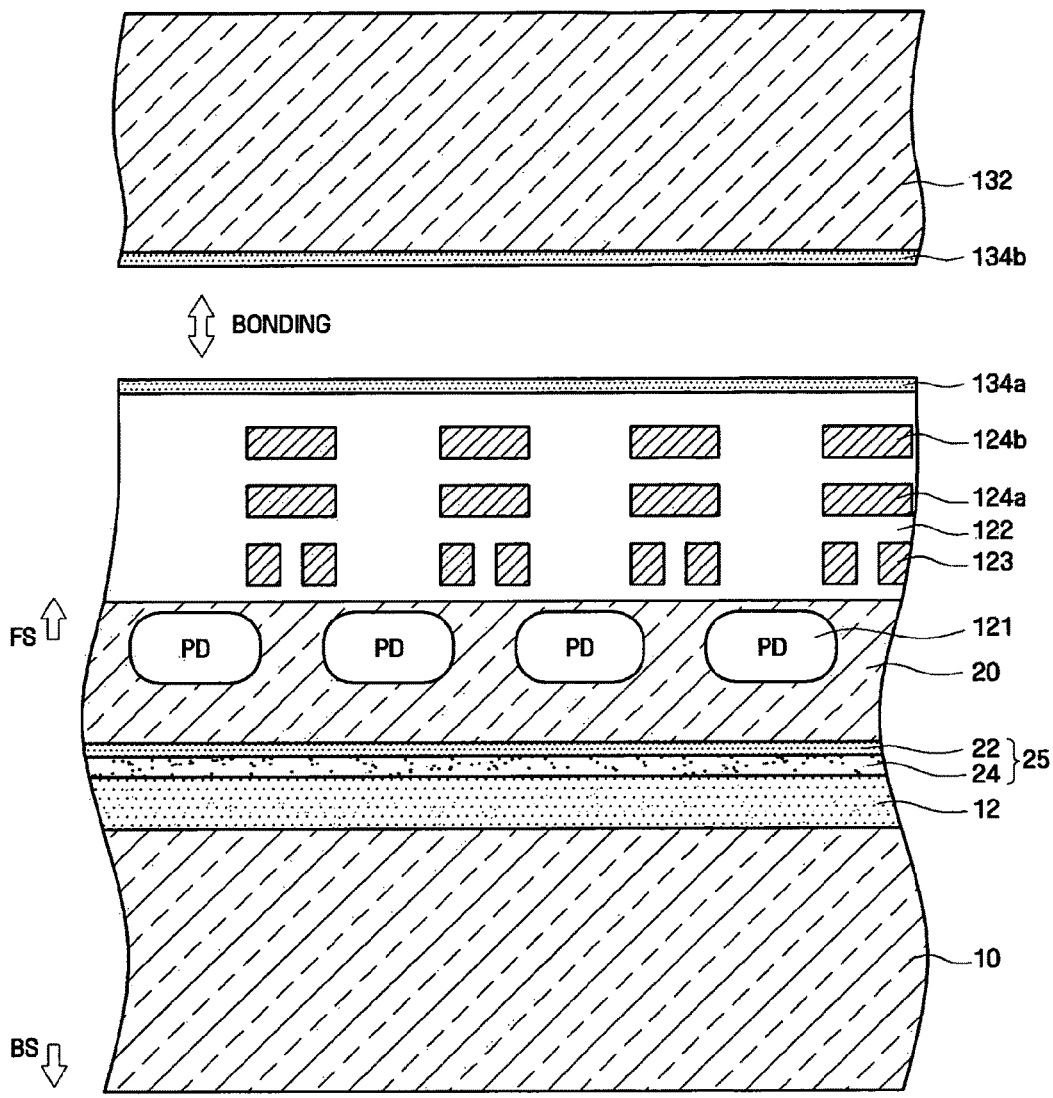

Referring to FIG. 4, a third substrate 132 may be bonded to the first and second substrates 10, 20, such that the metal interconnection patterns 124a, 124b are between the third substrate 132 and the second substrate 20. The third substrate 132 may be bonded on the interlayer dielectric layer 122 using one or more adhesive layers 134a, 134b, which may be formed on facing surfaces of the second substrate 20 and the third substrate 132. In another implementation, direct bonding may be used instead of adhesive.

Figure 5:
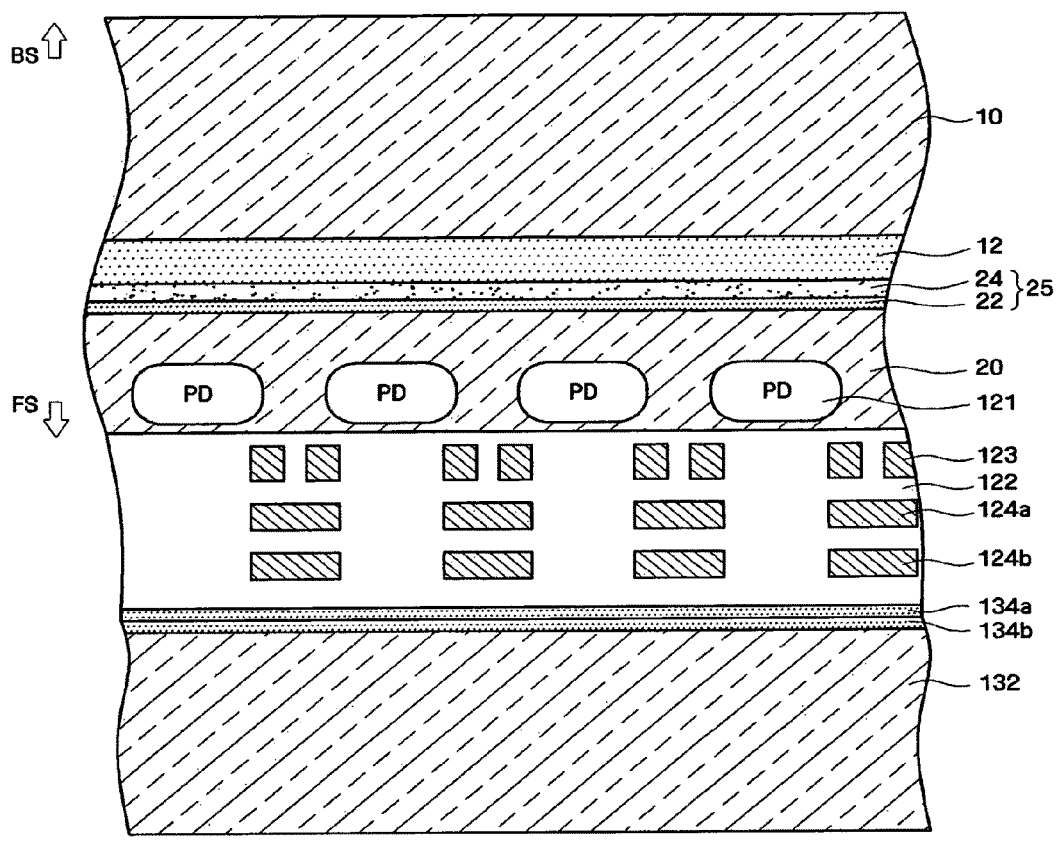
Figure 6:
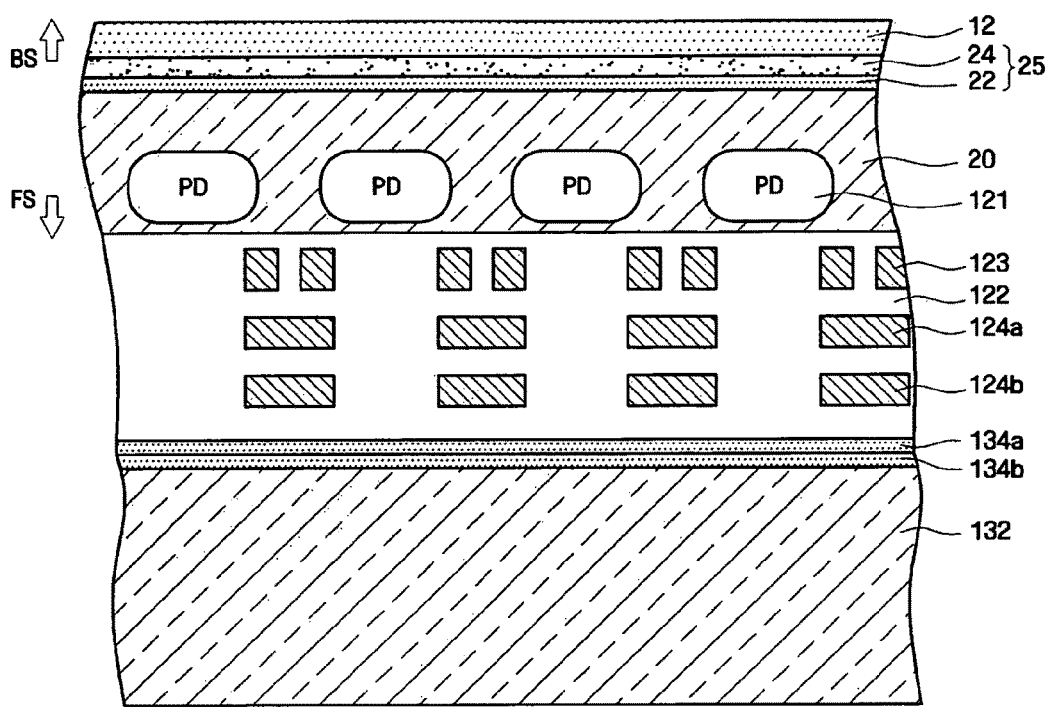

Referring to FIG. 5, it is noted that the structure is turned upside down with respect to FIG. 4. As shown in FIGS. 5 and 6, the first substrate 10 may be partially or completely removed. In an implementation, about 50% or more of the thickness of the first substrate may be removed. Removal may be performed using, e.g., a wet etch process, a dry etch process, CMP, back grinding, or a combination thereof. In the case that the first substrate 10 is completely removed, the etch stop layer 12 may serve to prevent over-etching. In an implementation, the removal process may be continued to partially or completely remove the etch stop layer 12. The removal process may be changed or adjusted as necessary if the etch stop layer 12 has a significantly different removal rate from that of the first substrate 10.

Figure 7:
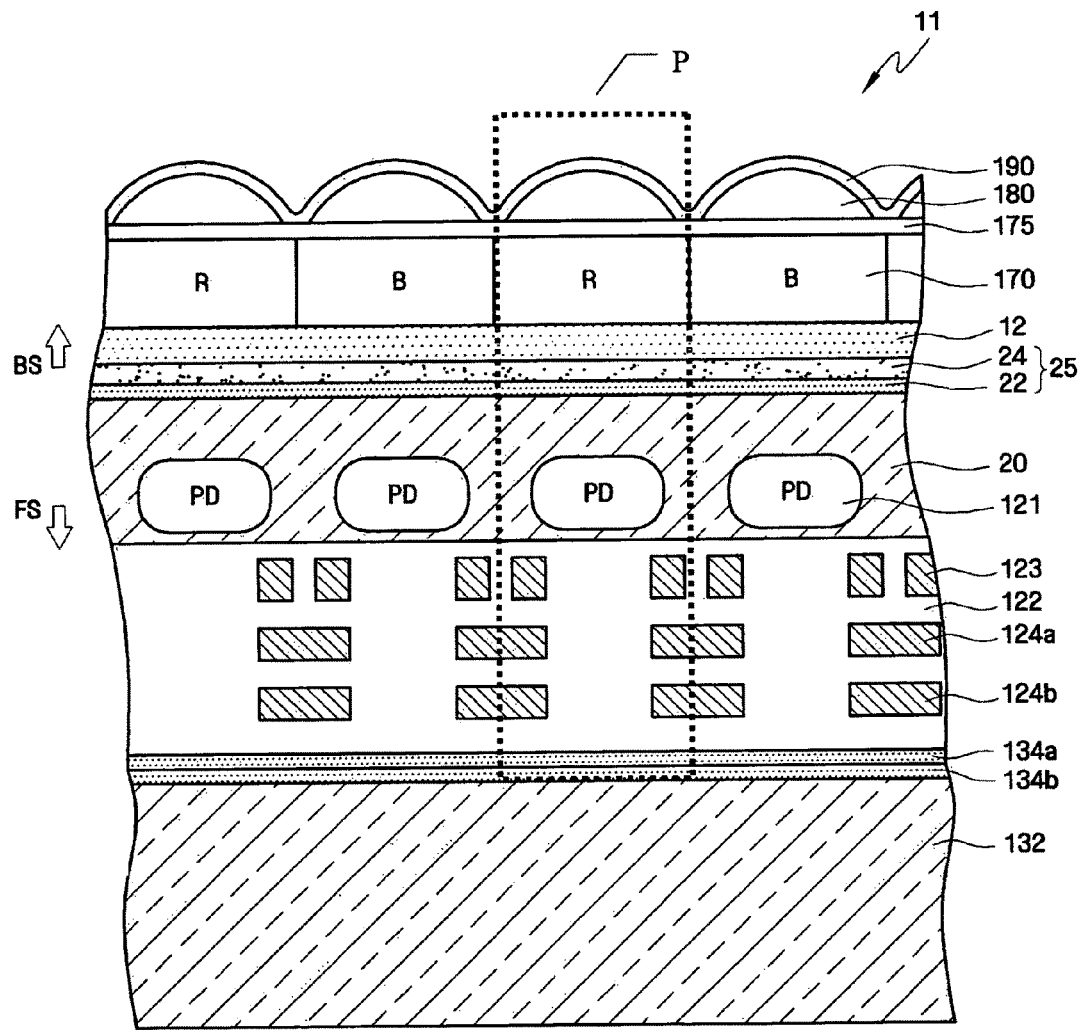

Referring to FIG. 7, a color filter structure 170, a top planarization layer 175, a micro lens structure 180, and a protection layer 190 of, e.g., an organic material, such as photoresist, or an inorganic material, may be sequentially formed on the etch stop layer 12. Forming the micro lens structure 180 may include, e.g., forming an organic material pattern on the top planarization layer 175, and then heating the organic material pattern to change the organic material pattern into lens shapes.

In an implementation (not shown), a planarization layer may be formed on the etch stop layer 12, between the etch stop layer 12 and the color filter structure 170. In the case that the etch stop layer 12 is completely removed, the color filter 170, the top planarization layer 175 and the micro lens structure 180 may be formed directly on the index matching layer 24. The protection layer 190 for the micro lens structure 180 may be conformally formed on the micro lens structure 180. The protection layer 190 may be an inorganic material including, e.g., silicon oxide, titanium oxide, zirconium oxide, halfnium oxide, or a combination thereof. Preferably, a low temperature oxide (LTO) is used as the protection layer 190. LTO is silicon oxide formed at a low temperature of about 100° C. to about 200° C., and, accordingly, the use of LTO may prevent heat-induced damage to pre-existing structures in underlying layers. Further, LTO may be formed as an amorphous material having a low roughness, which may help reduce reflection, refraction, and dispersion of incident light. Reflection, refraction, and dispersion of incident light may also be reduced by forming the protection layer 190 so as to fill spaces on the upper surface of the micro lens structure 180.

As is evident from FIG. 7, an image sensor according to the first embodiment may be formed using a sequence of operations that inverts the image sensor, such that metal interconnection patterns 124a, 124b and gate patterns 123 are positioned out of the light path, behind the light sensing devices 121. In an implementation, the size, patterns, and/or materials used for the metal interconnection patterns 124a, 124b and/or the gate patterns 123 may be selected to increase reflectivity, such that the metal interconnection patterns 124a, 124b and the gate patterns 123 reflect light back towards the light sensing devices 121, thereby improving light sensitivity of the image sensor.

Figure 8A:
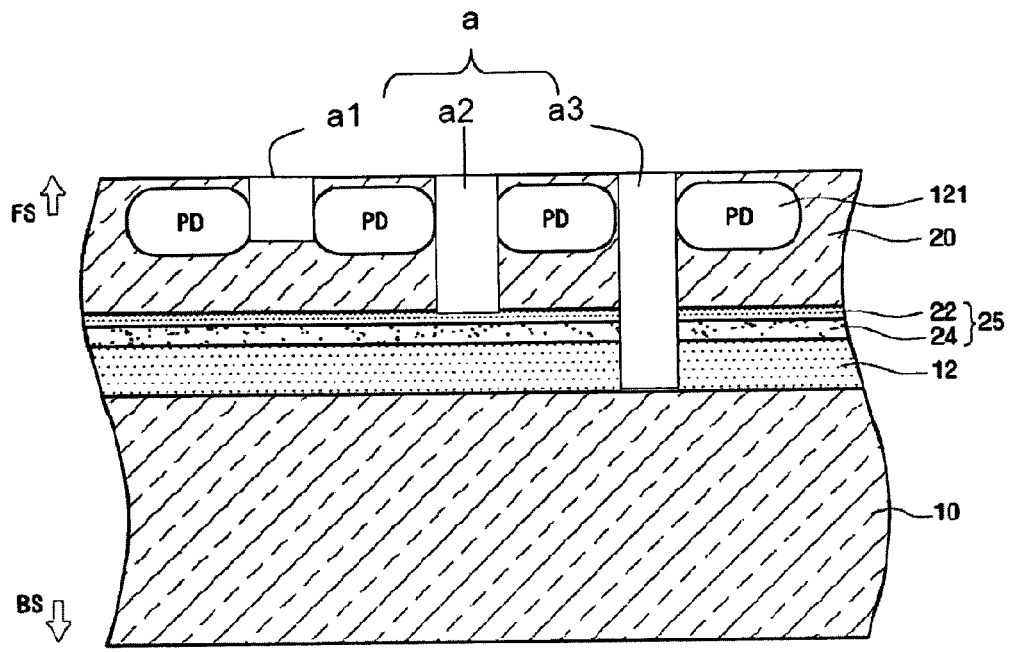
FIG. 8A illustrates an image sensor according to a second embodiment.

FIG. 8A illustrates an image sensor according to a second embodiment, in which one or more isolation layers 'a' may be formed to reduce cross-talk between adjacent light sensing devices 121. The isolation layers 'a' may be disposed between individual photo diodes PD, between adjacent unit pixels, etc.

Note that FIG. 8A is a composite illustration showing various implementations of the isolation layers 'a' in a single FIGURE. It will be appreciated that any one implementation isolation layers 'a' may be used alone, or in combination with one or more other implementations isolation layers 'a'. In a first implementation, an isolation layer a1 may be formed to extend from a region adjacent to a bottom portion of a photo diode PD to the surface FS of the second substrate 20. In a second implementation, an isolation layer a2 may be formed to contact the oxide layer 22 and extend to the surface FS of the second substrate 20. In a third implementation, an isolation layer a3 may be formed to pass through the anti-reflection layer 25, or to pass through the anti-reflection layer 25 and the etch stop layer 12, and extend to the surface FS of the second substrate 20. Forming the isolation layers 'a' may include, e.g., filling a trench with an insulation material such as an oxide layer, a nitride layer, etc. Forming the isolation layers 'a' may also include, e.g., forming islands of a metal material or ion implantation. When ion implantation is used, the isolation layers 'a' may be formed directly, without the need to create and fill a trench.

Figure 8B:
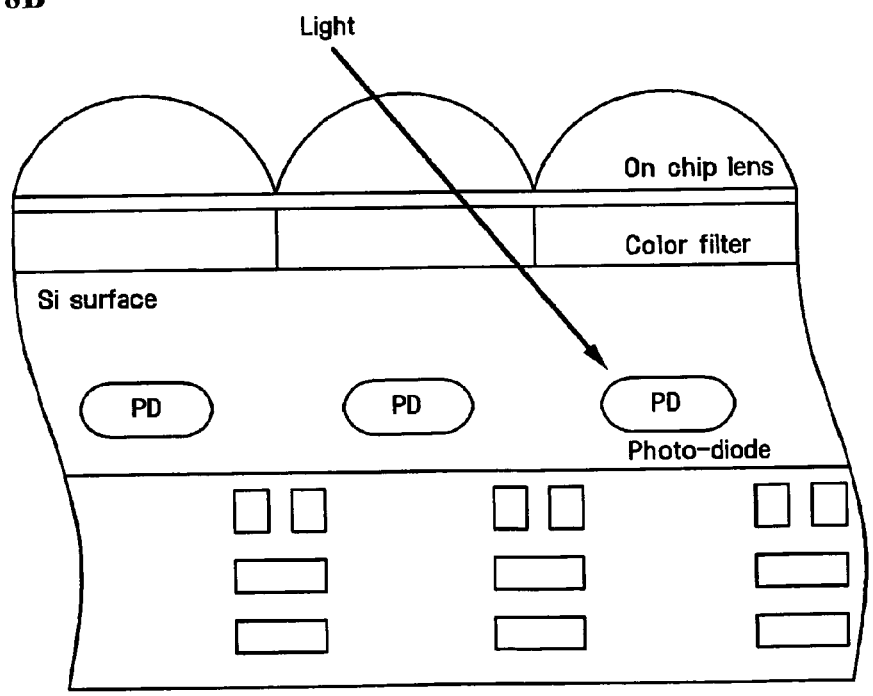
FIG. 8B illustrates the effect of an angled component of incident light in generating cross-talk.

In further detail, cross-talk between adjacent light sensing devices may occur in a back side image sensor as a result of light incident upon the back side image sensor at an angle. FIG. 8B illustrates the effect of an angled component of incident light in generating cross-talk. Referring to FIG. 8B, light may enter the back side image sensor at an angle through a first lens (middle lens in FIG. 8B), such that the light is incident upon a sensor, e.g., a photo diode, that is disposed to one side, rather than directly below, the first lens. As shown in FIG. 8B, the back side image sensor may have the metal interconnection pattern formed on the front side of the substrate, i.e., opposite to the back side of the substrate on which the color filter and the micro lens structure are formed. Accordingly, the angled component of the incident light is not blocked by the metal interconnection pattern, and may be absorbed into adjacent pixel region such that crosstalk is generated. Accordingly, as shown in FIG. 8A, one or more isolation layers 'a' may be employed to reduce or elimate cross talk.

Figures 1, 8C:
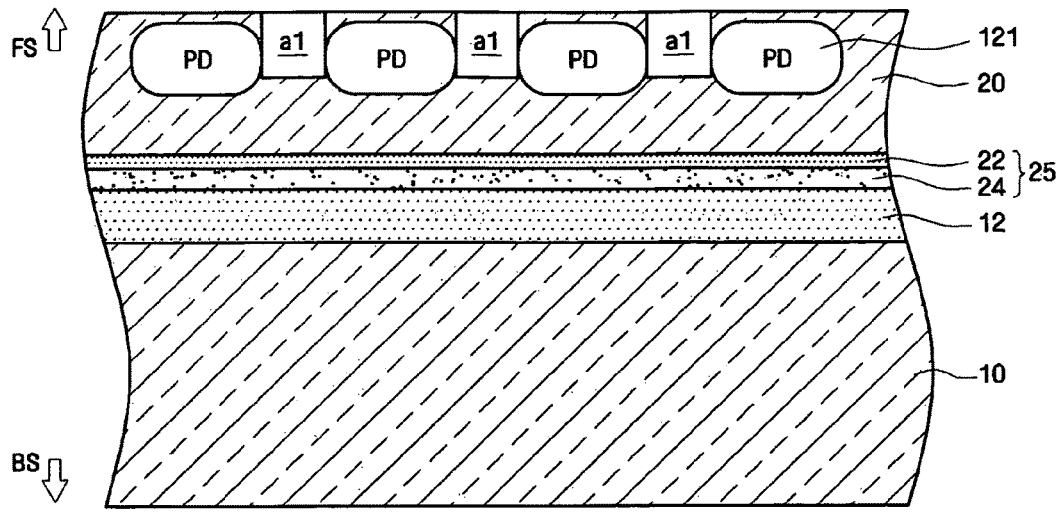
Figures 2, 8C:
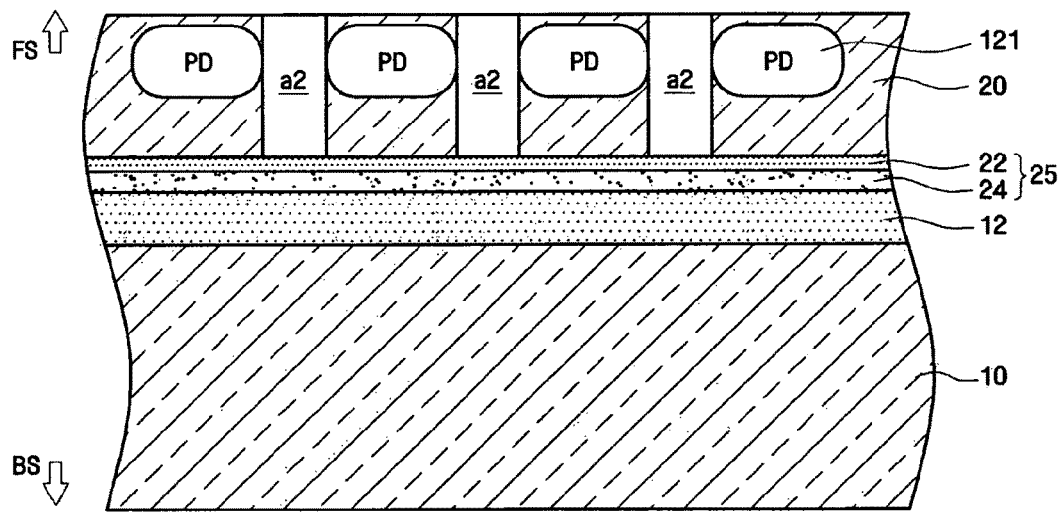
Figures 3, 8C:
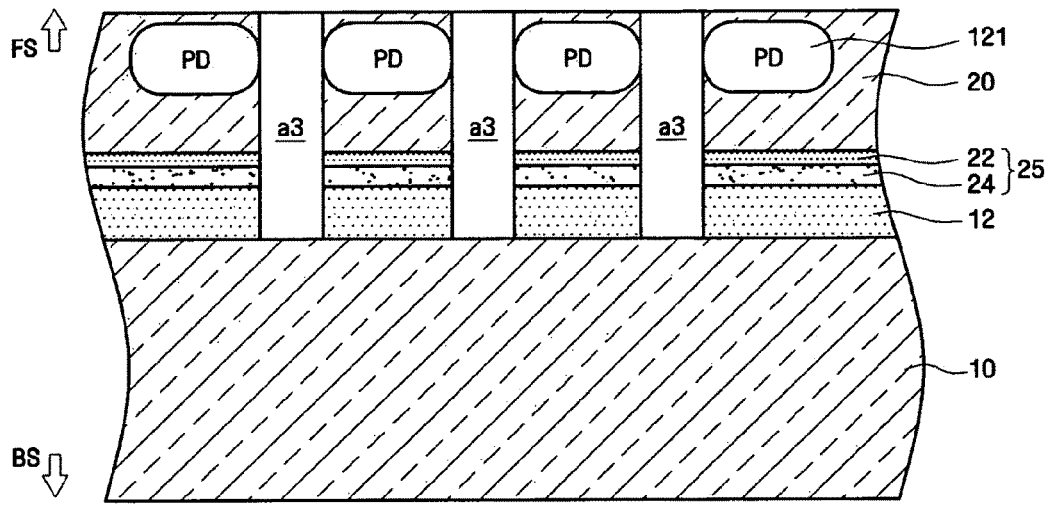

FIGS. 8C-1, 8C-2, and 8C-3 illustrate examples of the first, second, and third implementations of an image sensor according to the second embodiment. Referring to FIG. 8C-1, a plurality of the isolation layers a1 may be interposed between adjacent unit pixels, etc., so as to prevent cross-talk between photo diodes PD. The isolation layers a1 may be formed before or after forming the photo diodes PD. Each isolation layer a1 may be formed to extend from the region adjacent to the bottom portion of the photo diode PD to the surface FS of the second substrate 20. Referring to FIG. 8C-2, a plurality of the isolation layers a2 may be formed to contact the oxide layer 22 and to extend to the surface FS of the second substrate 20. Referring to FIG. 8C-3, a plurality of the isolation layers a3 may be formed to pass through the anti-reflection layer 25, or further, e.g., through the anti-reflection layer 25 and the etch stop layer 12. The isolation layers a3 may extend to the surface FS of the second substrate 20.

Figures 2A, 8D:
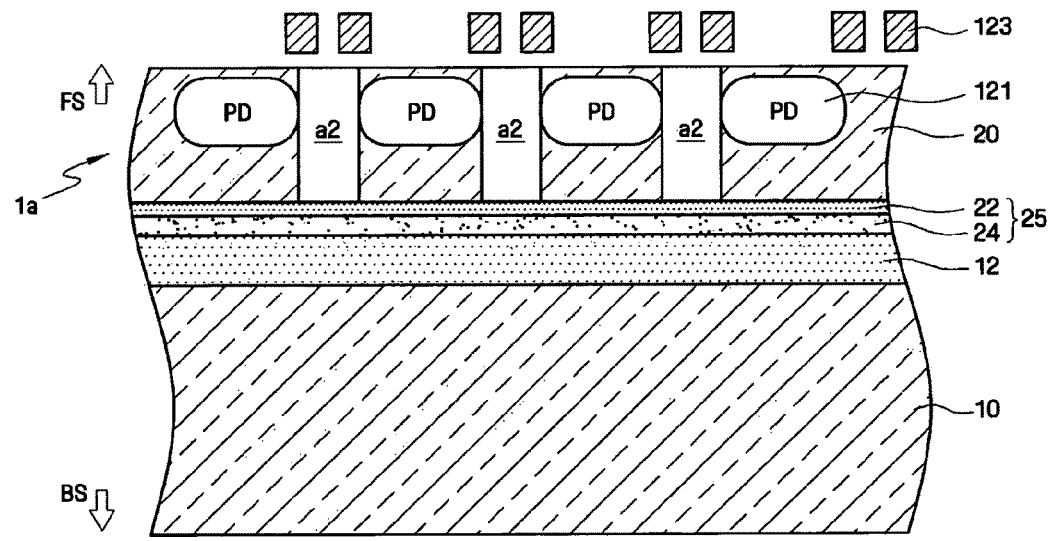
FIGS. 8D-2(a) to 8D-2(f) illustrate cross-sectional views of stages in a method of fabricating an image sensor that includes the structure of FIG. 8C-2.
Figures 2B, 8D:
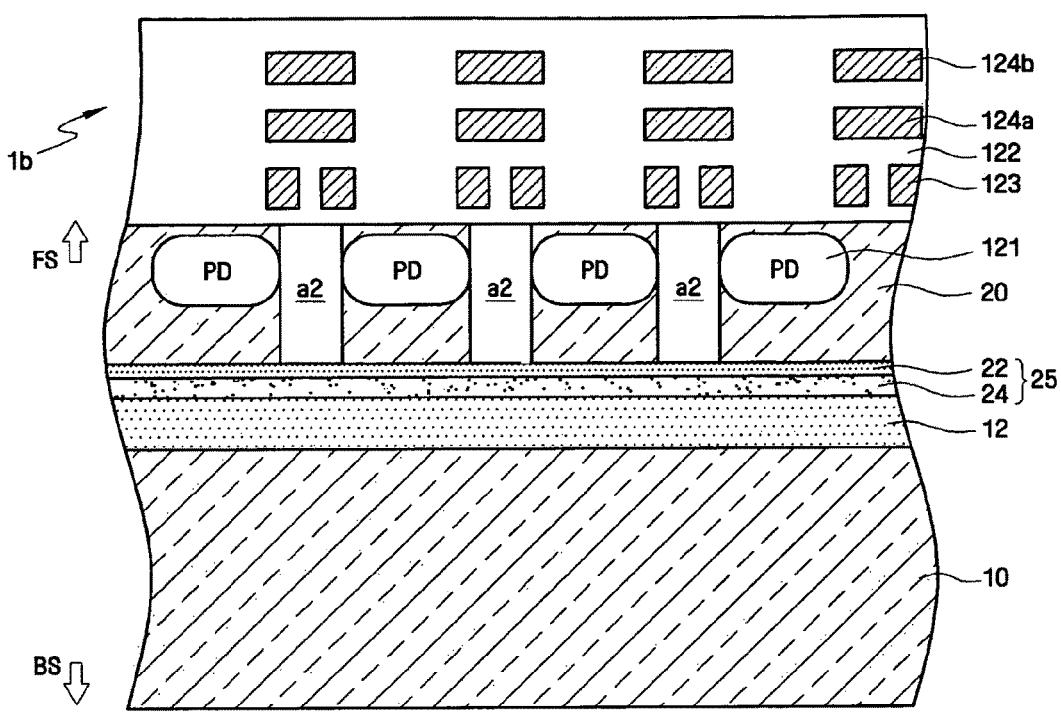
Figures 2C, 8D:
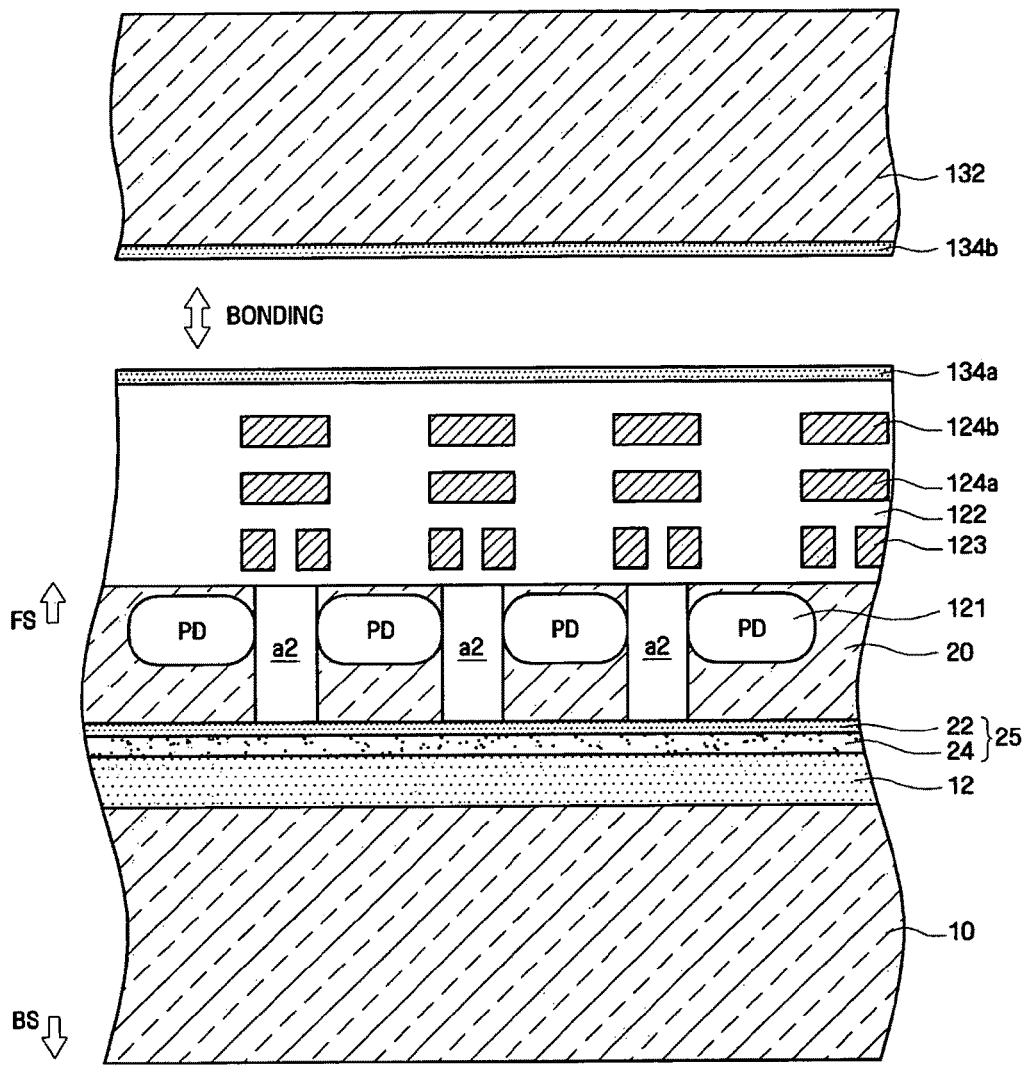
Figures 2D, 8D:
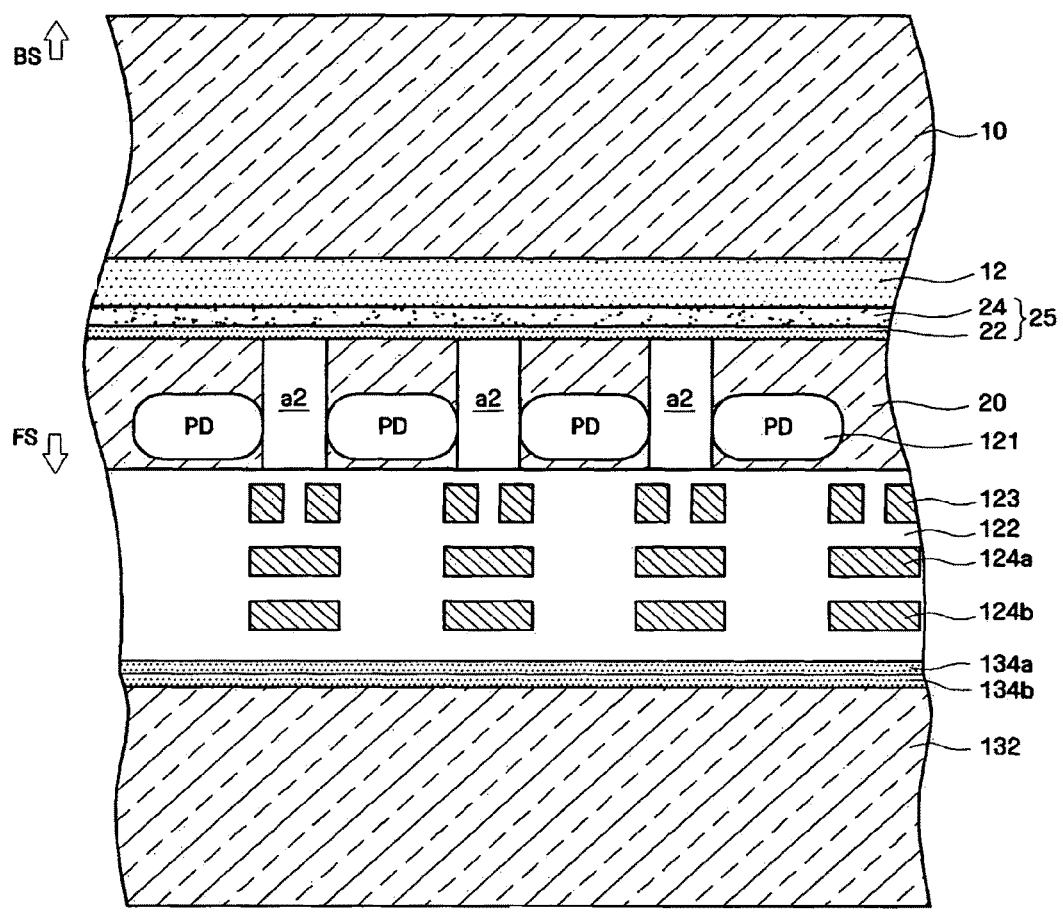
Figures 2E, 8D:
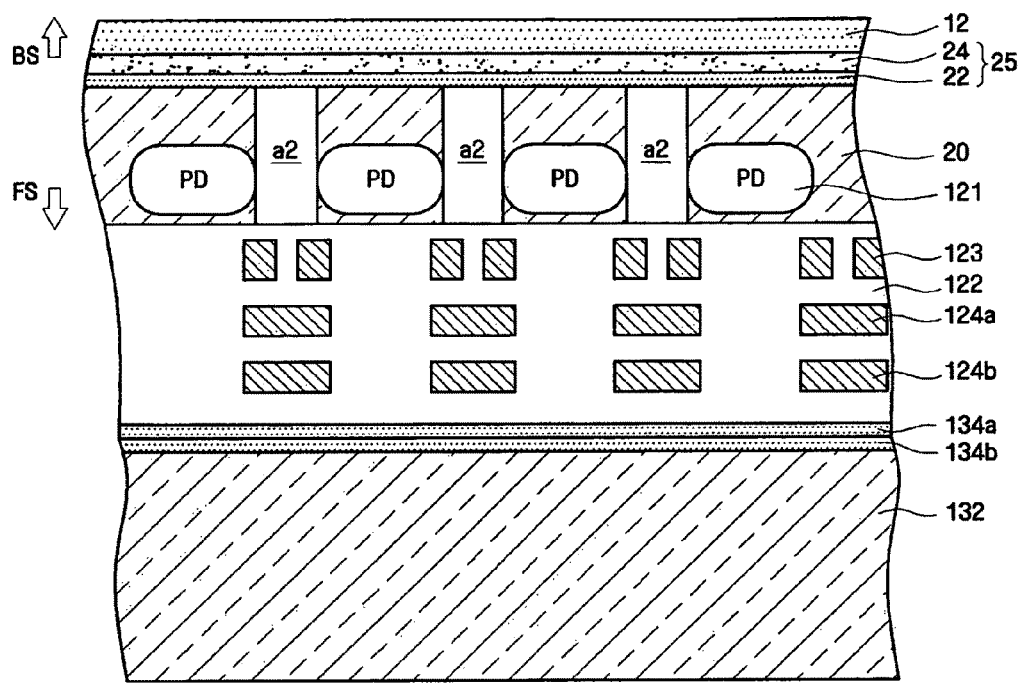
Figures 2F, 8D:
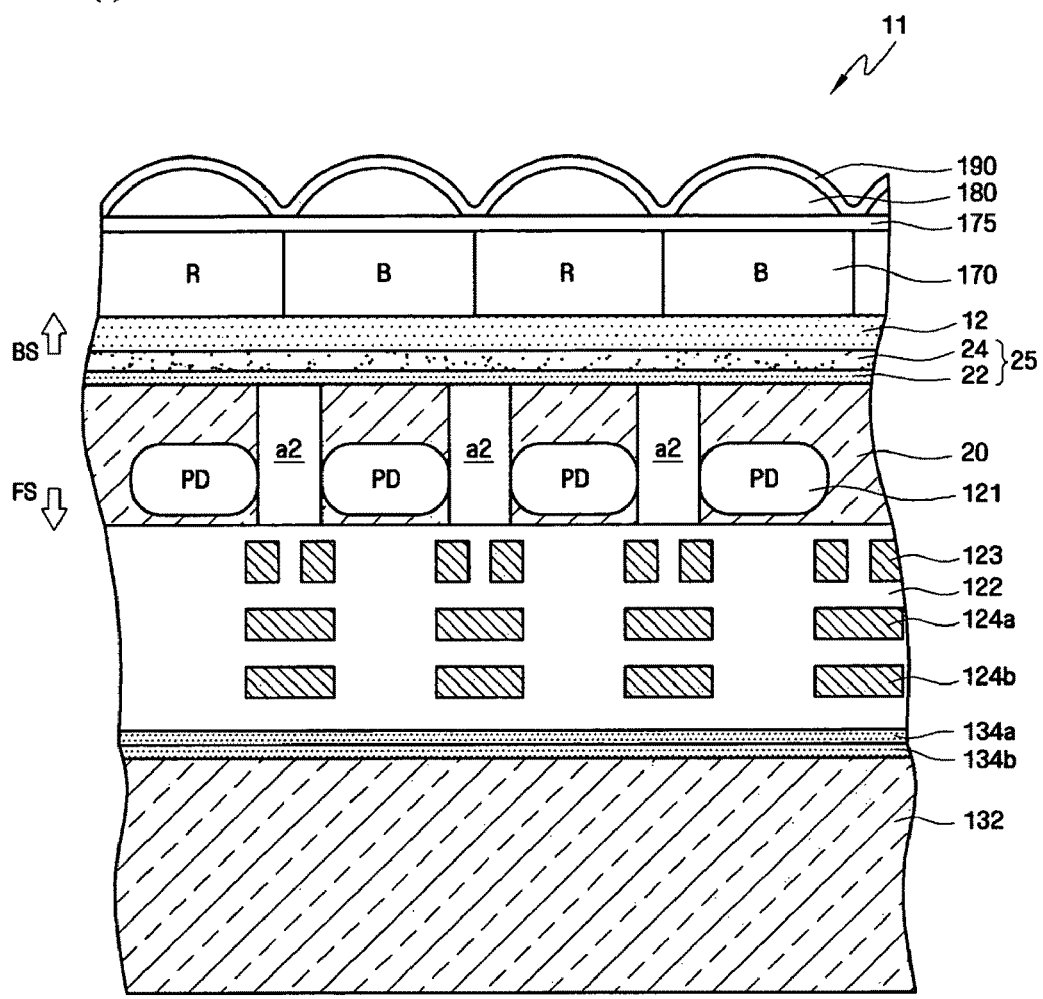

FIGS. 8D-2(*a*) to 8D-2(*f*) illustrate cross-sectional views of stages in a method of fabricating an image sensor that includes the structure of FIG. 8C-2. Referring to FIG. 8D-2(*a*), a plurality of gates 123 may be formed on the surface FS of the substrate 20. The isolation layers a2 may be disposed between adjacent photo diodes PD in region 1*a* of the second substrate 20, and the gates 123 may be formed above, e.g., so as to be aligned with, the isolation layers a2. The gates 123 may include, e.g., a charge transfer gate, a reset gate, a drive gate, etc.

Referring to FIG. 8D-2(*b*), the metal interconnection pattern structure, which may include the interlayer dielectric layer 122 and the plurality of metal interconnection patterns 124*a*, 124*b*, may be formed in region 1*b* of the second substrate 20. The metal interconnection patterns 124*a*, 124*b* may include, or may be formed of, aluminum, copper, etc. In case of a copper interconnection pattern, the copper interconnection pattern may include, e.g., a single damascene interconnection or a dual damascene interconnection.

Referring to FIG. 8D-2(*c*), the third substrate 132 may be bonded on the interconnection structure 122, 124*a*, 124*b*, e.g., using adhesive layers 134*a*, 134*b*. For example, the adhesive layer 134*a* may be formed first on the interconnection structure 122, 124*a*, 124*b*, and then the top surface of the adhesive layer 134*a* may be planarized. Further, the surface of the interconnection structure 122, 124*a*, 124*b* may be planarized before forming the adhesive layer 134*a* thereon. The adhesive layer 134*b* may be formed on the third substrate 132, and the third substrate 132 may be bonded to the second substrate 20 by the two adhesive layers 134*a*, 134*b* facing each other. In another example (not shown), a direct bonding method may be used, e.g., by activating surfaces of the interconnection structure 122, 124*a*, 124*b* and the third substrate 132 using a plasma treatment and then bonding the activated surfaces to each other.

Referring to FIG. 8D-2(*d*), the assembly of the first, second, and third substrates 10, 20, 132 may be inverted, such that the first substrate 10 is uppermost.

Referring to FIG. 8D-2(*e*), the first substrate 10 may be removed. For example, the first substrate 10 may be removed to expose the etch stop layer 12 using the etch stop layer 12 as a etch stop in a wet or dry etch process, a CMP process, a back grinding (BGR) process, a combination thereof, etc. In an implementation, the etch stop layer 12 may not be removed. In another implementation, the etch stop layer 12 may be partially or completely removed. In still another implementation, the first substrate 10 may be thinned, without removing the entirety thereof, so that a portion of the first substrate 10 remains on the etch stop layer 12.

Referring to FIG. 8D-2(*f*), the color filter structure 170, the top planarization layer 175, the micro lens structure 180, etc., may be sequentially formed on the etch stop layer 12. The protection layer 190 of, e.g., an organic material, such as photoresist, or an inorganic material, may be formed on the color filter structure 170. The protection layer 190 may be a conformal layer that covers the top planarization layer 175 and the micro lens structure 180. In another implementation (not shown), the etch stop layer 12 may be completely removed, and the color filter structure 170, the top planarization layer 175, the micro lens structure 180, etc., may be formed on the index matching layer 24. Further, a bottom planarization layer may be disposed under the color filter structure 170.

In the resulting structure shown in FIG. 8D-2(*f*), the plurality of gates 123 and the metal interconnection patterns 124*a*, 124*b* may be used as a reflecting plate. The reflecting plate may reflect light such that incident light passing through the second substrate 20 is returned back to the light sensing devices 121, which may increase the light sensitivity of the image sensor.

Figures 1, 8E:
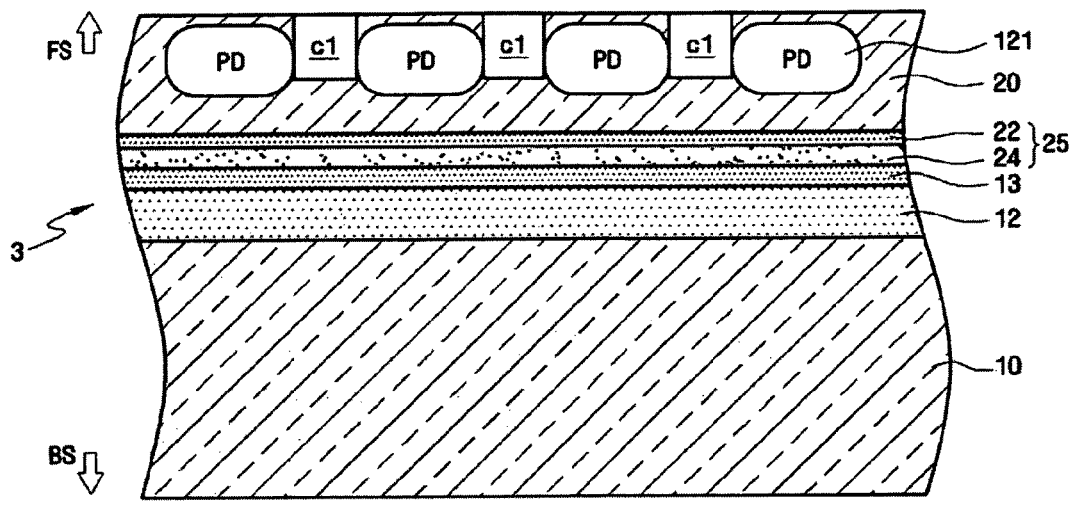
Figures 2, 8E:
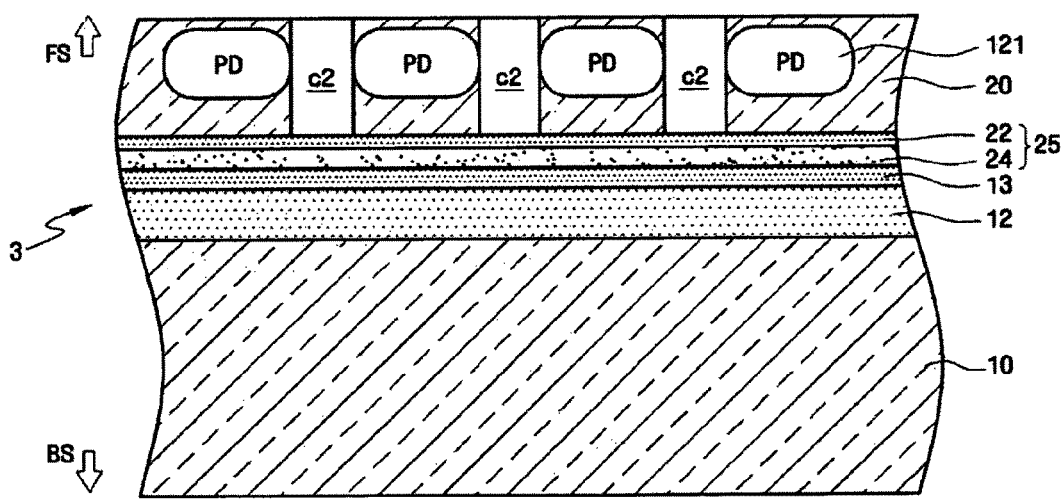
Figures 3, 8E:
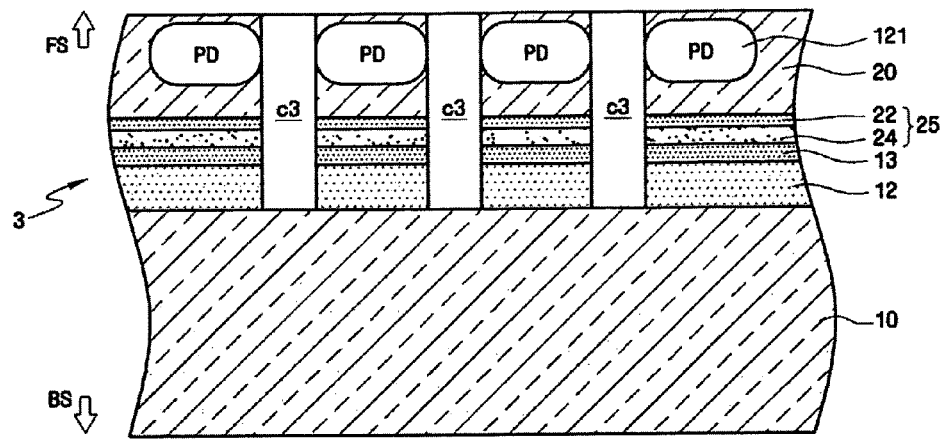

FIGS. 8E-1, 8E-2, and 8E-3 illustrate additional examples of image sensors according to the second embodiment. Referring to FIG. 8E-1, an adhesive layer 13 may be disposed between the etch stop layer 12 and the anti-reflective layer 25. Also, before or after forming photo diodes PD, an isolation layer c1 may be interposed between adjacent unit pixels, etc., so as to prevent cross-talk between photo diodes. The isolation layer c1 may extend from a position adjacent to a bottom portion of the photo diode PD to the surface FS of the second substrate 20. The isolation layer c1 may be formed by, e.g., filling a trench with an insulation material such as an oxide layer, a nitride layer, or an isolated metal material, or by a introducing a conductive impurity using ion implantation.

Referring to FIG. 8E-2, in another example of an image sensor according to the second embodiment, an isolation layer c2 may extend to contact the anti-reflective layer 25. Also, as for the example described above in connection with FIG. 8E-1, the adhesive layer 13 may be disposed between the etch stop layer 12 and the anti-reflective layer 25.

Referring to FIG. 8E-3, in still another example of an image sensor according to the second embodiment, an isolation layer c3 may be formed passing through at least the anti-reflective layer 25, the adhesive layer 13, and the etch stop layer 12.

Figure 9A:
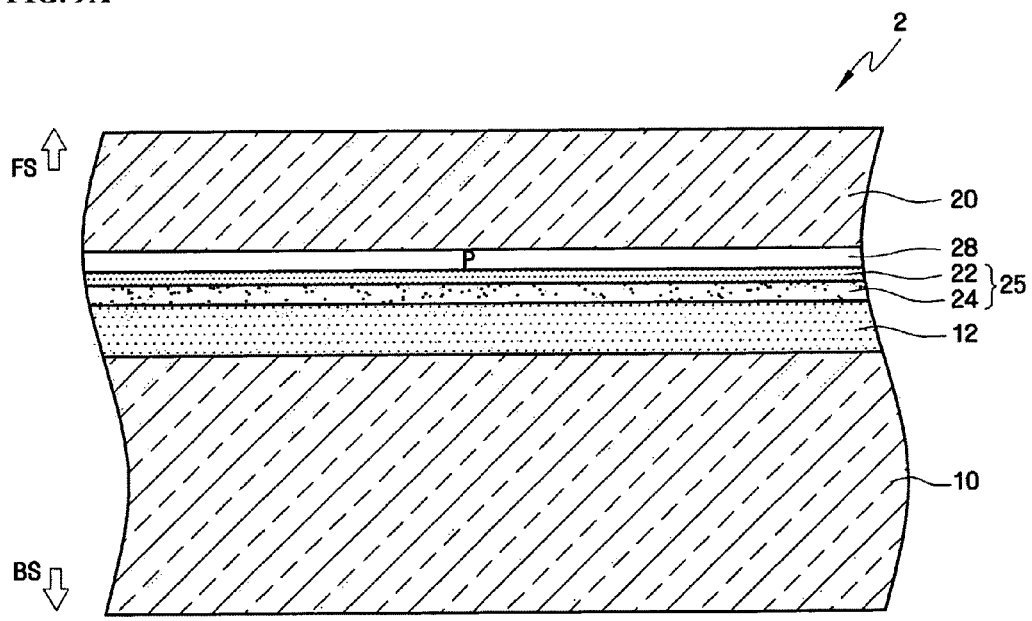
FIG. 9A illustrates a cross-sectional view of a stage in a method of fabricating an image sensor according to a third embodiment.

FIG. 9A illustrates a cross-sectional view of a stage in a method of fabricating an image sensor according to a third embodiment. By way of reference, FIG. 9A generally corresponds to the stage illustrated in FIG. 1. Details of features shown in FIG. 1 and common to FIG. 9A have been described above and will not be repeated. Additionally, subsequent processing stages have been described above, and will not be repeated.

Referring to FIG. 9A, a shallow implant layer 28, which serves as a pinning layer, may be formed adjacent to the second substrate 20. The shallow implant layer 28 may be disposed between the bulk of the second substrate 20 and the oxide layer 22. The shallow implant layer 28 may further reduce the concentration of interfacial traps between the second substrate 20 and the oxide layer 22, such that the dark current may be further reduced and the light sensitivity may be further enhanced.

In the case that the second substrate 20 has p-type conductivity, the shallow implant layer 28 may be formed by implanting a p-type impurity, e.g., boron, into the second substrate 20. A high dose of impurities may be implanted, e.g., boron having a concentration of about 1E10 to about 1E15 atoms/cm$^2$ boron at an energy of about 1 KeV to about 5 KeV. In an implementation, a laser anneal step, i.e., laser irradiation of the shallow implant layer 28, may be performed after ion implantation to activate the impurities in the shallow implant layer 28. The order of operations may then continue as described above in connection with FIGS. 1 to 7. Notably, the order of operations described herein provides the flexibility and thermal budget to activate the impurities prior to the formation of heat-sensitive structures, e.g., metal interconnection patterns, image sensing devices, etc., on the first and/or second substrates 10, 20.

Figures 1, 9B:
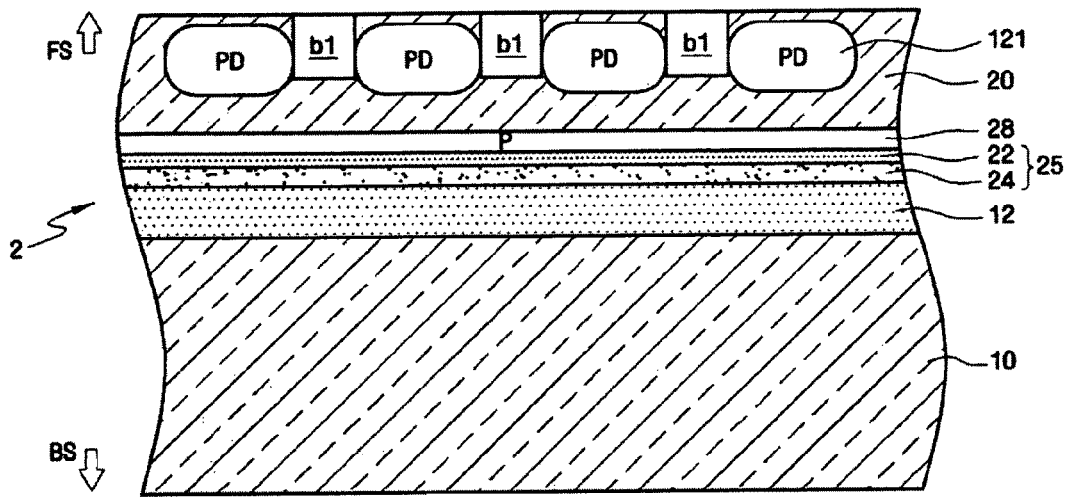
Figures 2, 9B:
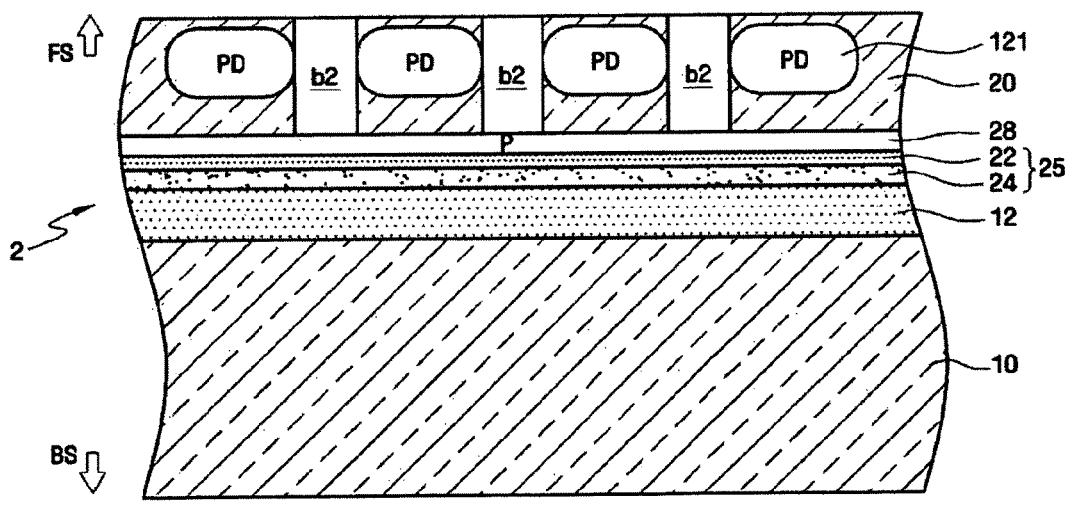
Figures 3, 9B:
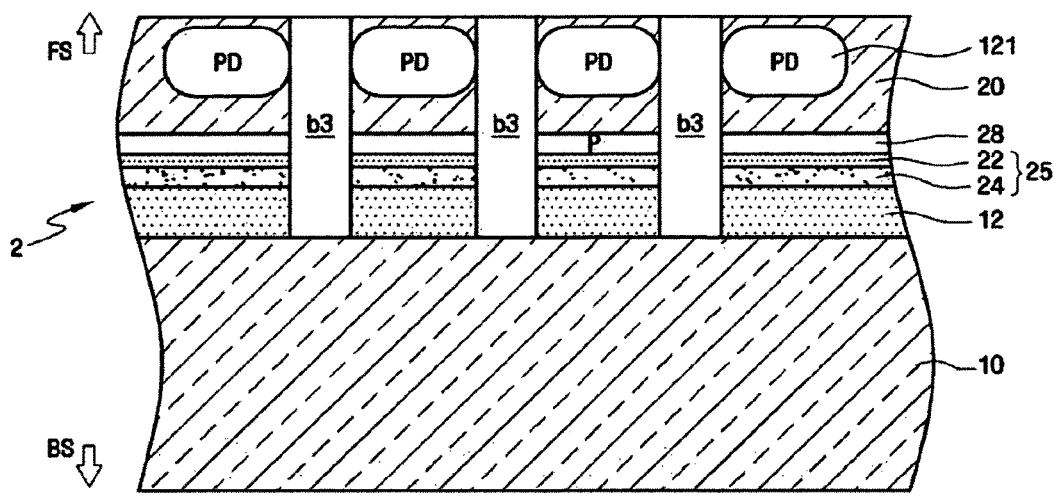

FIGS. 9B-1, 9B-2, and 9B-3 illustrate examples of image sensors that include features of the third embodiment in combination with features of the second embodiment. Referring to FIG. 9B-1, the shallow implant layer 28 may be formed between the second substrate 20 and the oxide layer 22, e.g., using ion implantation of a P-type impurity at a high dose. In an implementation, the impurity may be boron doped at a concentration of about 1E10 to about 1E15 atoms/cm$^2$, and at an energy of about 1 KeV to about 5 KeV. Additionally, the image sensor may include isolation layers, e.g., isolation layers b1, to prevent cross-talk. The isolation layers b1 may be formed to extend from adjacent to a bottom portion of the photo diodes PD to the surface FS of the second substrate 20. The isolation layers b1 may be interposed between adjacent unit pixels, etc., and may be formed before or after forming the photo diodes PD. In an implementation, the isolation layers b1 may be formed by filling a trench with an insulation material such as an oxide layer, a nitride layer, or an isolated metal material, or by introducing a conductive impurity using ion implantation.

Referring to FIG. 9B-2, in another example, isolation layers b2 may be formed to extend from the shallow implant layer 28 to the surface FS of the second substrate 20. Other features shown in FIG. 9B-2 may be the same as those described above in connection with FIG. 9B-1.

Referring to FIG. 9B-3, in still another example, isolation layers b3 may be formed to pass through the shallow implant layer 28, the anti-reflection layer 25, and the etch stop layer 12. The isolation layers b3 may extend to the surface FS of the second substrate 20. Other features shown in FIG. 9B-2 may be the same as those described above in connection with FIG. 9B-1.

Figure 10:
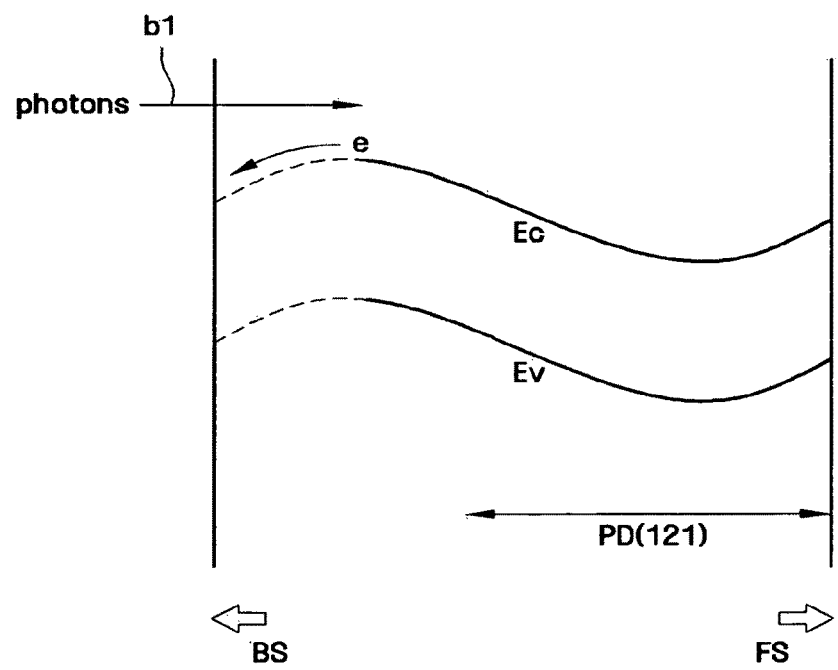
FIGS. 10 and 11 illustrate comparative diagrams of a potential well.
Figure 11:
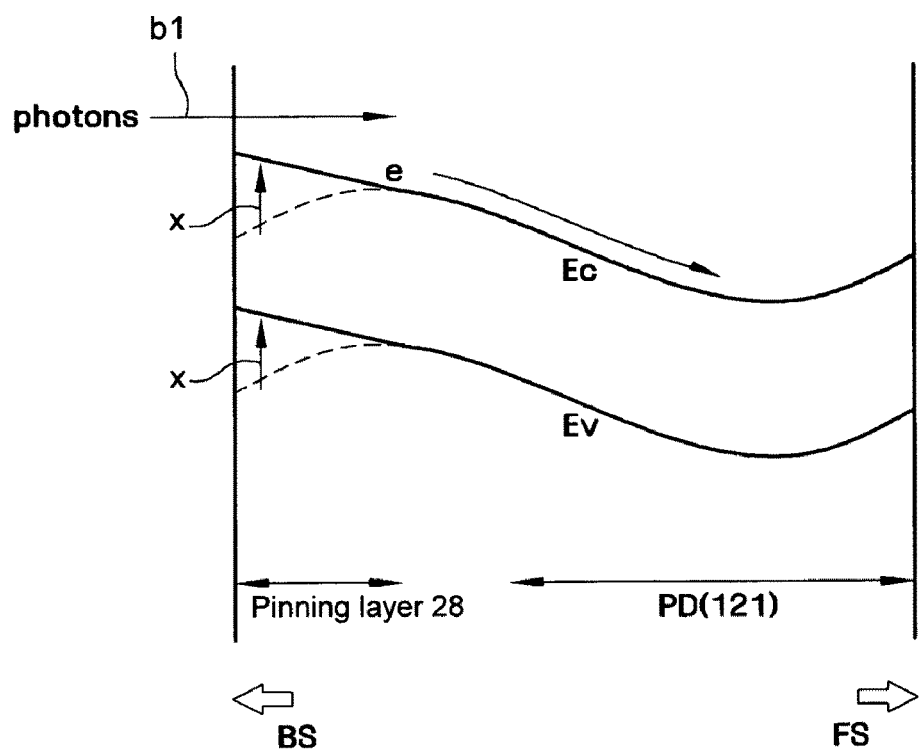

FIGS. 10 and 11 illustrate diagrams of a potential well for explaining beneficial effects that may be obtained by forming the shallow implant layer 28 in the image sensor. FIG. 10 illustrates a case where no shallow implant layer 28 is used. Referring to FIG. 10, photons b1 encountering interfacial traps at the surface BS of second substrate 20 may generate electrons that are prevented from exiting the second substrate 20 due to a depletion well. In FIG. 10, Ev represents a valence band, Ec represents a conduction band, and dashed lines represent a depletion well potential.

The depletion well may be formed at the surface of the second substrate 20 by interfacial traps in the oxide layer 22, and/or in the interface between the oxide layer 22 and the second substrate 20. The interfacial traps may exhibit donor-like characteristics. When the trap is not filled with an electron, the trap has a positive state. This positive charge may attract an electron adjacent the surface of the second substrate 20 and push a positive charge in the second substrate 20 from the surface of the second substrate 20 toward a photo diode PD. Thus, a depletion well may be formed at the surface of the second substrate 20. A depth of the depletion well may become greater as the number of interfacial traps increases. Further, the depth of the depletion well may be increased as the doping level (impurity concentration) of the second substrate 20 is reduced.

As shown in FIG. 10, in the presence of a depletion well, when a short wavelength photon b1 enters, a charge generated in the second substrate 20 may be accumulated in the depletion well due to electric field thereof, rather than in the photo diode PD. Thus, the depletion well may cause the light sensitivity of the photo diode PD (or other light sensing device 121) to be reduced, i.e., the quantum efficiency of the image sensor may be reduced.

FIG. 11 illustrates a case where the shallow implant layer 28 is used. As shown in FIG. 11, the depletion well may be eliminated by the shallow implant layer 28, thereby changing the surface potential from that of the depletion well by amount 'x'. In the shallow implant layer 28, the hole of p-type shallow implant layer 28 may recombine with the electron of the surface BS of the second substrate 20, so to become a neutral state.

When a short wavelength photon b1 enters, a charge generated in the second substrate 20 may thus be accumulated in the photo diode PD (or other light sensing device 121), rather than in the depletion well. Thus, inclusion of the shallow implant layer 28 may improve device performance by reducing interfacial trap density and, thereby, reducing degradation of device sensitivity caused by depletion wells. Moreover, the shallow implant layer 28 may act as a potential barrier, so that a charge which is formed without light input may not be accumulated in the photo diode PD, thus reducing dark current.

Figure 12:
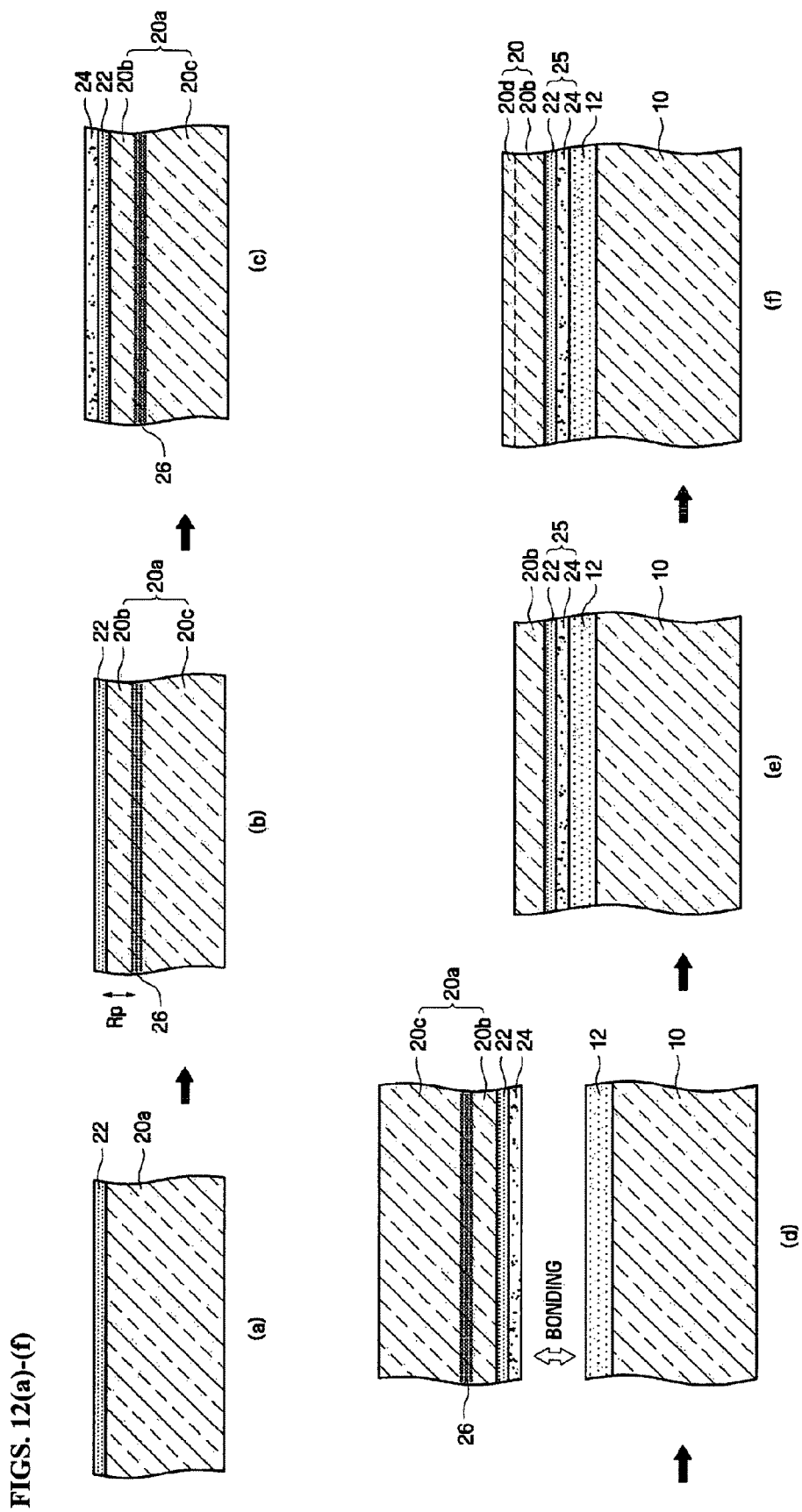
FIGS. 12(a)-(f) illustrate cross-sectional views of stages in a method of fabricating an image sensor according to a fourth embodiment.

FIGS. 12(a)-(f) illustrate cross-sectional views of stages in a method of fabricating an image sensor according to a fourth embodiment, in which substrate cleavage is performed. Referring to FIG. 12(a), the oxide layer 22 may be formed on a second substrate 20a. The oxide layer 22 is preferably a thermal oxide layer formed to a thickness of about 5 Å to about 1,000 Å using a thermal oxidation process at a temperature of more than 400° C.

Referring to FIG. 12(b), a micro cavity layer 26 may be formed in the second substrate 20a by ion implanting with ions of, e.g., hydrogen, a noble gas, etc. The ion implantation may be performed at a level of about 5E16 ($5 \times 10^{16}$) atoms/cm$^2$ and an energy of about 100 KeV, at a temperature that is under about 350° C. The depth of ion implantation may be at a mean distance Rp, such that the implantation forms the micro cavity layer 26 at position that divides the second substrate 20a into a first region 20b and a second region 20c, where the first region 20b and the second region 20c are respectively above and below the micro cavity layer 26.

The micro cavity layer 26 is preferably formed after forming the oxide layer 22. This may prevent separation of the substrate, which could result if a thermal oxidation process were to be used to form the oxide layer 22 after formation of the micro cavity layer 26. In particular, the thermal oxidation process could cause coalescence of the cavities in the micro cavity layer 26, thus resulting in unwanted substrate separation.

Referring to FIG. 12(c), the index matching layer 24, e.g., a nitride layer, may be formed on the oxide layer 22. The index matching layer 24 may be formed to a thickness of about 50 Å to about 1,000 Å using, e.g., a thermal process.

Referring to FIG. 12(d), the etch stop layer 12 may be formed on the first substrate 10. The etch stop layer 12 is preferably an oxide layer or a thermal oxide layer having a thickness of about 1,000 Å to about 10,000 Å. Subsequently, the first substrate 10 may be bonded to the second substrate 20a such that the etch stop layer 12 faces the index matching layer 24.

Referring to FIG. 12(e), the second substrate 20b may be cleaved at the micro cavity layer 26. For example, the second region 20c of the second substrate 20a may be removed by heat treatment, e.g., at a a temperature of about 400° C. to about 700° C., or by mechanical force, leaving the first region 20b. The introduction of the micro cavity layer 26 and the cleavage of the second substrate 20b may be performed using methods set forth in U.S. Pat. Nos. 5,994,207, 6,391,740, 6,221,740, 6,645,828, 5,374,564, 6,020,252, 6,225,192, and 6,809,009, the disclosures of which are hereby incorporated by reference in their entireties and for all purposes.

Referring to FIG. 12(f), an epitaxial layer 20d may be formed on the first region 20b, if needed for long wavelength light. For a CMOS image sensor, it may be desirable for the first region 20b to be thick enough to absorb some wavelengths of light. However, the operations of ion implantation and substrate cleavage described in connection with FIGS. 12(b) and 12(e) may only be effective to produce the micro cavity layer 26 at a depth of about 1.5 µm, such that the thickness of the first region 20b after substrate cleavage may only be about 1.5 µm. A thickness of 1.5 µm may be insufficient to absorb substantial amounts of some wavelengths of light. For example, for red light having a wavelength of 700 nm, or for longer-wavelength infrared (IR) light, a silicon wafer having a thickness of 3 µm may absorb about 50% of the light. Further, a silicon wafer thickness of between about 4 µm and about 10 µm may be desired to absorb most or all of the 700 nm (or longer-wavelength IR) light.

It will be appreciated that substrate cleavage may place the light sensing devices 121 close to the light-receiving surface of the image sensor. Accordingly, according to an embodiment, an epitaxial process may be performed to grow an epitaxial layer 20d, e.g., epitaxial silicon, on the surface of region 20b that is exposed by the substrate cleavage operation. In an implementation, the thickness of the epitaxial layer may be about 3.5 µm to about 4 µm. The light sensing devices 121 may then be formed on the epitaxial layer. Thus, the relatively thin layer 20b formed by substrate cleavage may be supplemented by the epitaxial layer 20d so as to space the light sensing devices 121 further away from the light-receiving side of the image sensor.

Figure 13:
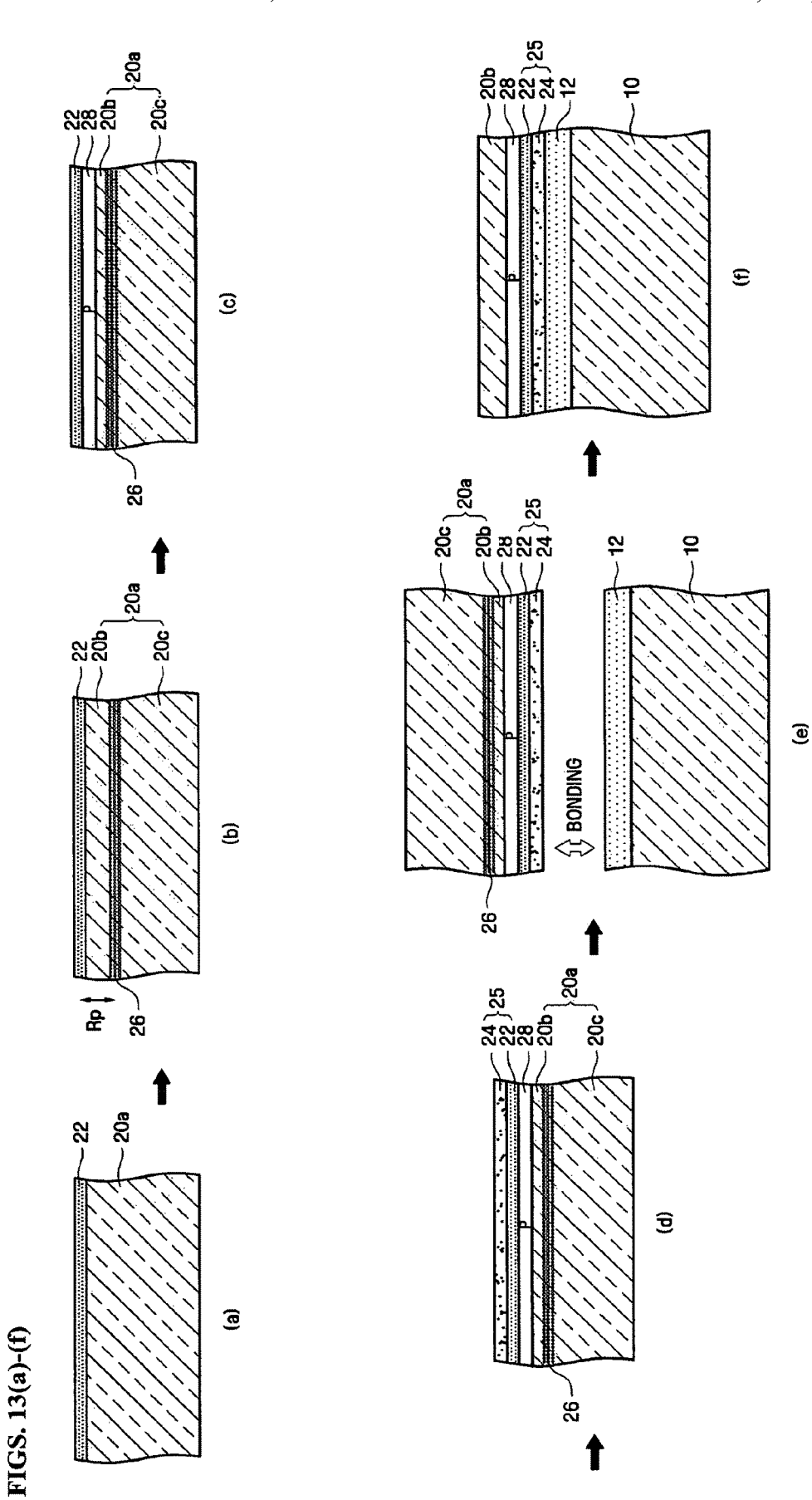
FIGS. 13(a)-(f) illustrate cross-sectional views of stages in a method of fabricating an image sensor according to a fifth embodiment.

FIGS. 13(a)-(f) illustrate cross-sectional views of stages in a method of fabricating an image sensor according to a fifth embodiment, in which the shallow implant layer 28 is formed and substrate cleavage using the micro cavity layer 26 is employed. Referring to FIGS. 13(a) and 13(b), the oxide layer 22 may be formed on the second substrate 20a, and the micro cavity layer 26 may be formed by ion implantation at a mean distance Rp from the upper surface of the second substrate 20a, in the same manner as described above in connection with FIGS. 12(a) and 12(b).

Subsequently, as shown in FIG. 13(c), the shallow implant layer 28 may be formed below the oxide layer 22, e.g., by ion implantation at an energy sufficient to cause the shallow implant to penetrate the oxide layer 22 and form the shallow implant layer 28 below the oxide layer 22. Activation of the dopant, e.g., by laser annealing or some other type of heating operation, may be performed to activate the shallow implant in the shallow implant layer 28. As discussed above, performing activation at this stage may be enabled by the absence of heat-sensitive structures, which may be formed in later stages of the method, such that a large thermal budget is available for the activation.

The operations shown in FIGS. 13(d) to 13(e) may be the same as those described above in connection with FIGS. 12(c)-(e). Briefly, referring to FIG. 13(d), the index matching layer 24 may be formed on the oxide layer 22. Referring to FIG. 13(e), the etch stop layer 12 may be formed on the first substrate 10, and, subsequently, the first substrate 10 may be bonded to the second substrate 20a such that the etch stop layer 12 faces the index matching layer 24. Referring to FIG. 13(f), the second substrate 20b may be cleaved at the micro cavity layer 26. If desired, the epitaxial layer 20d may be formed in the manner described above in connection with FIG. 12(f).

Figure 14:
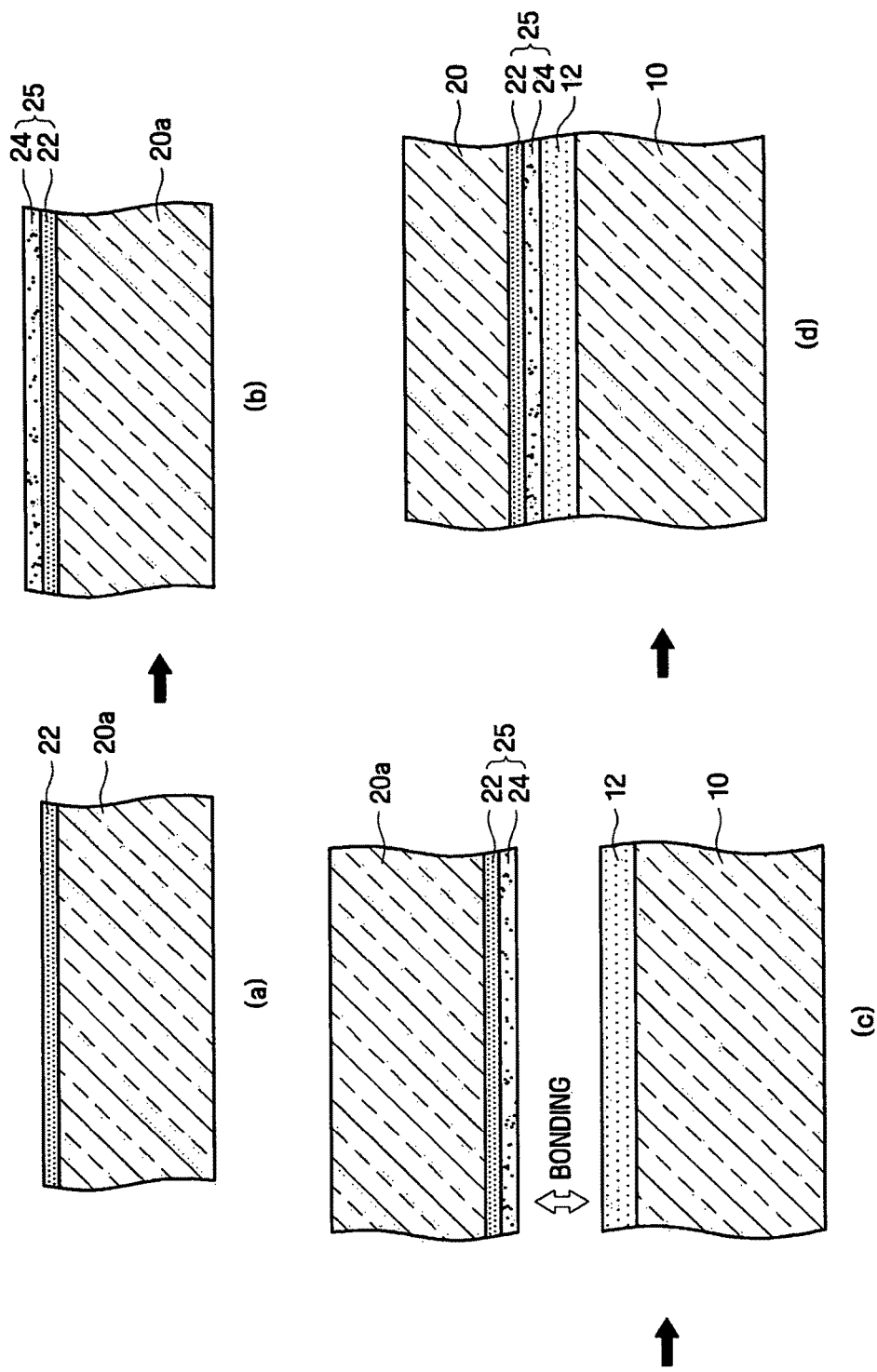
FIGS. 14(a)-(d) illustrate cross-sectional views of stages in a method of fabricating an image sensor according to a sixth embodiment.

FIGS. 14(a)-(d) illustrate cross-sectional views of stages in a method of fabricating an image sensor according to a sixth embodiment, in which a thinning operation is used to reduce the thickness of the second substrate 20a. Referring to FIG. 14(a), the oxide layer 22 may be formed in the same manner as described above. Then, as shown in FIG. 14(b), the index matching layer 24 may be formed, without forming the micro cavity layer 26 discussed above in connection with the fourth and fifth embodiments.

Referring to FIG. 14(c), the etch stop layer 12 may be formed on the first substrate 10. Subsequently, the first substrate 10 may be bonded to the second substrate 20a such that the etch stop layer 12 faces the index matching layer 24.

Referring to FIG. 14(d), a portion of the second substrate 20a may be removed, e.g., using an etch or CMP process, so as to thin the second substrate 20a.

If desired, the epitaxial layer 20d may be formed in the manner described above in connection with FIG. 12(f). For example, the epitaxial layer may be formed on the second substrate 20 in FIG. 14(d) after removing the portion thereof.

Figure 15:
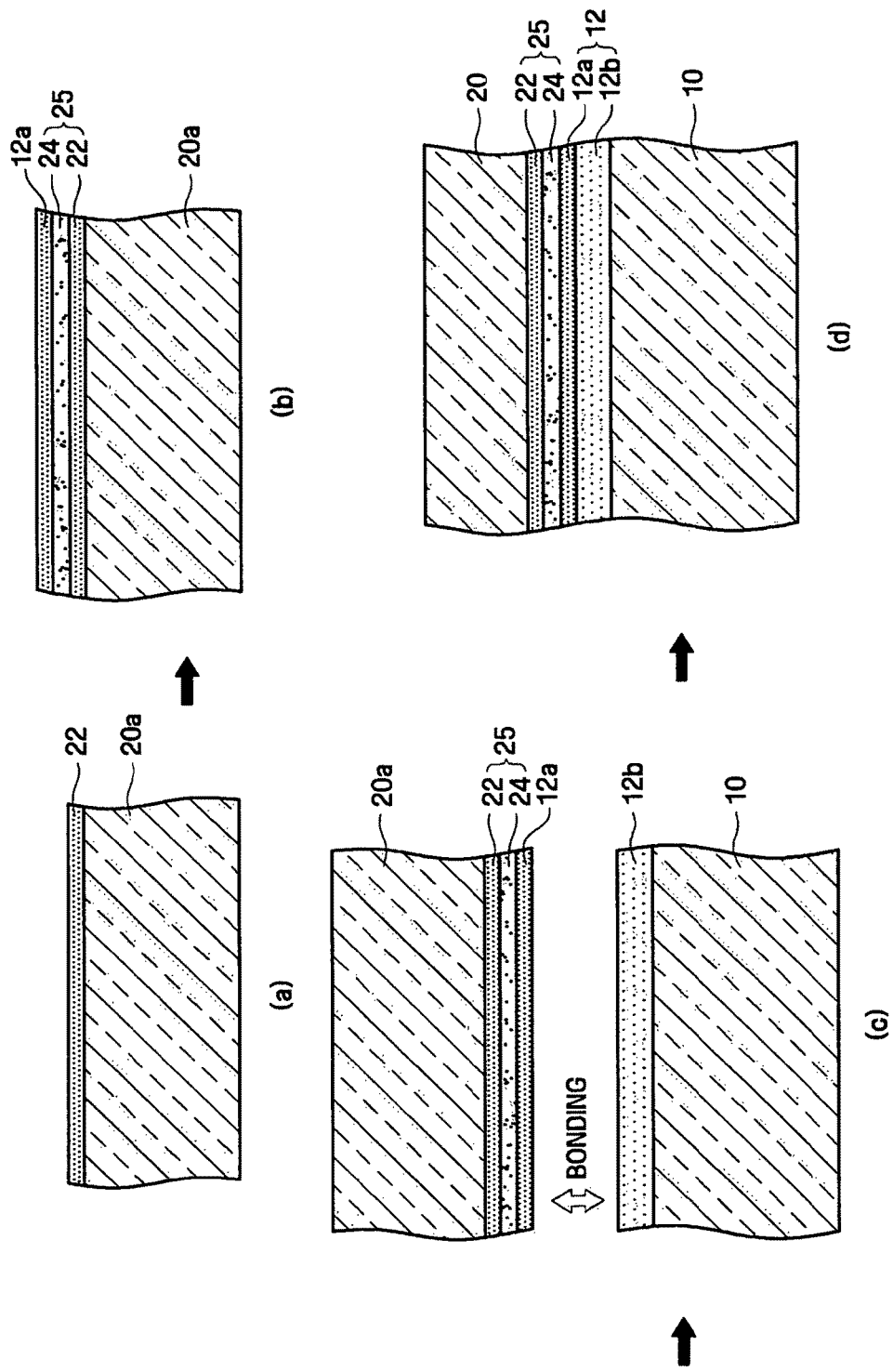
FIGS. 15(a)-(d) illustrate cross-sectional views of stages in a method of fabricating an image sensor according to a seventh embodiment.

FIGS. 15(a)-(d) illustrate cross-sectional views of stages in a method of fabricating an image sensor according to a seventh embodiment, in which wafer bonding is achieved using two oxide layers facing one another, which may enhance bonding strength. Referring to FIG. 15(a), the oxide layer 22 may be formed in the same manner as described above. If desired, the micro cavity layer 26 may be formed as described above (not shown in FIG. 15(a)).

Referring to FIG. 15(b), the index matching layer 24 may be formed on the oxide layer 22. In the case that the index matching layer 24 is a nitride layer, bond strength between the index matching layer 24 and an oxide stop layer on the first substrate 10 may be weaker than bond strength between facing oxide layers. Accordingly, as shown in FIG. 15(b), an oxide layer 12a may be formed on the index matching layer 24 in order to provide oxide-oxide bonding.

Referring to FIG. 15(c), a etch stop layer 12b of an oxide may be formed on the first substrate 10. Subsequently, the first substrate 10 may be bonded to the second substrate 20a such that the etch stop layer 12b faces the oxide layer 12a, and the substrates are bonded together by adhesion between the etch stop layer 12b and the oxide layer 12a. Thus, bonding strength between the first and second substrates 10, 20 may be enhanced. Of course, it will be appreciated that the use of facing oxide layers to enhance bond strength may also be employed in connection with the above-described embodiments. Similarly, as described above in connection with FIG. 1, two opposing index matching layers 24 may be formed, e.g., a nitride layer on each of the oxide layer 22 and the etch stop layer 12, and the first and second substrates 10, 20 may be joined by bonding facing surfaces of the opposing index matching layers 24.

Figure 16:
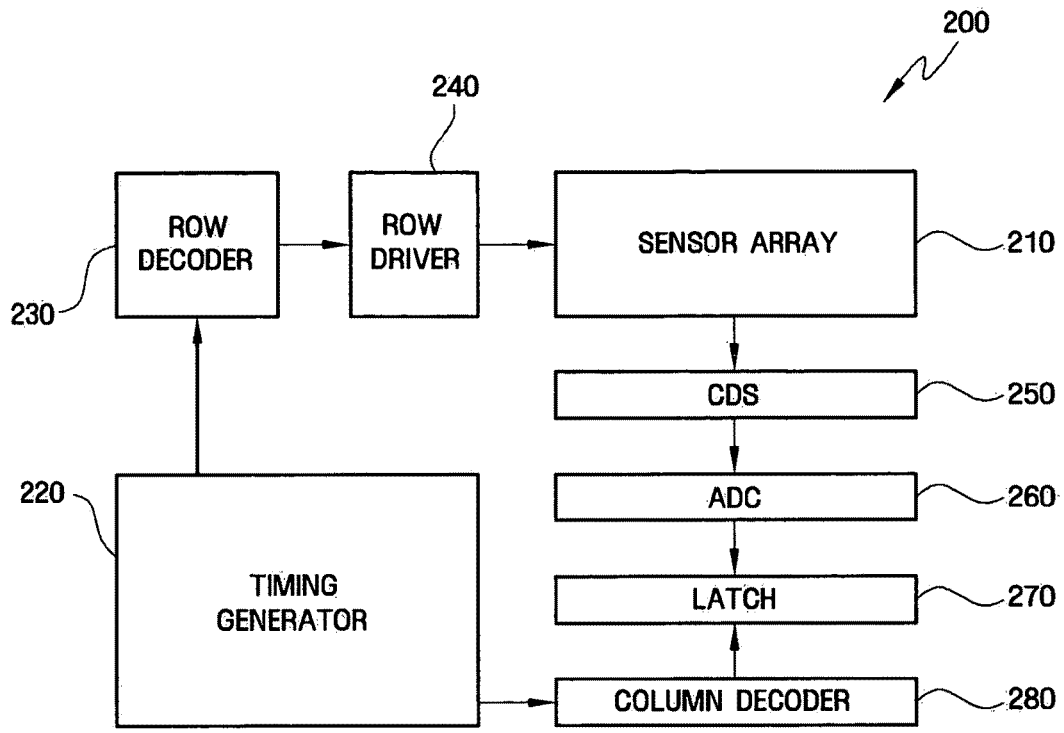
FIG. 16 illustrates an image sensing device according to an eighth embodiment.

FIG. 16 illustrates an image sensing device 200 according to an eighth embodiment. Referring to FIG. 16, the image sensing device 200 may include, e.g., a sensor array 210 such as a CMOS sensor array, a timing generator 220, a row decoder 230, a row driver 240, a correlated double sampler (CDS) 250, an analog-to-digital converter (ADC) 260, a latch 270, and a column decoder 280, which may all be formed on a single substrate, i.e., as one chip, or one more than one substrate. Where more than one chip or substrate are employed, they may all be packaged in a single package.

The sensor array 210 may include a plurality of unit pixels arranged in two dimensions, e.g., rows and columns, and may serve to convert an optical image into an electrical output signal. The sensor array 210 may operate by receiving a plurality of driving signals, e.g., a row selection signal, a reset signal, a charge transfer signal, etc., from the row driver 240. The sensor array 210 may provide an electrical output signal to the CDS 250.

The timing generator 220 may provide a timing signal and a control signal to the row decoder 230 and the column decoder 280. The row driver 240 may provide the plurality of driving signals for driving the plurality of unit pixels, according to the result decoded from the row decoder 230, to the sensor array 210.

The CDS 250 may sample and hold the electrical output signal received from the sensor array 210. The ADC 260 may convert the analog signal from the CDS into a digital signal. The latch 270 may latch the digital signal, and the latched signal may be sequentially output in an image signal handling part (not shown) according to the result decoded from the decoder 280.

Figure 17A:
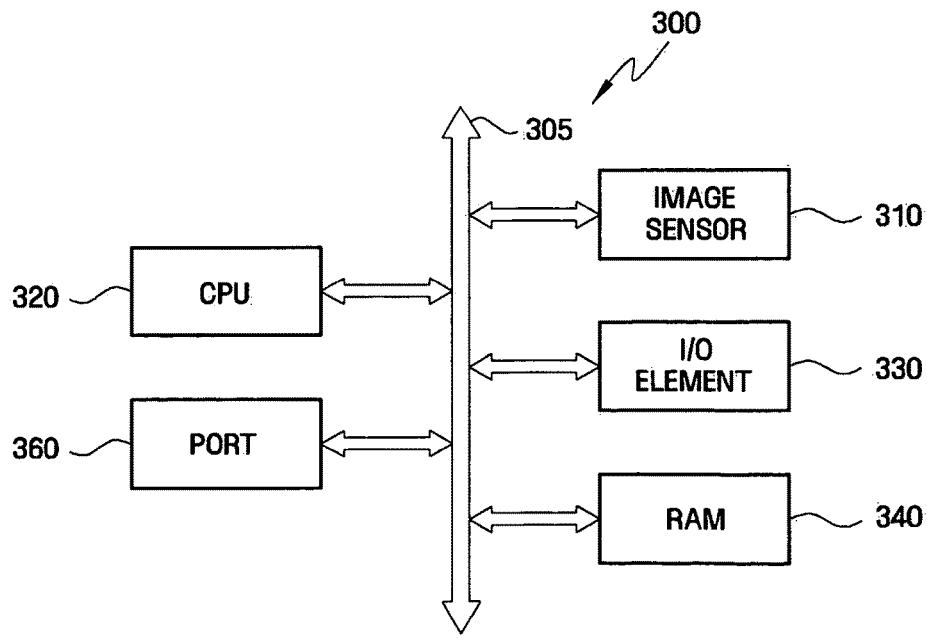
FIG. 17(a) illustrates a computer apparatus including an image sensor according to a ninth embodiment.
Figure 17B:
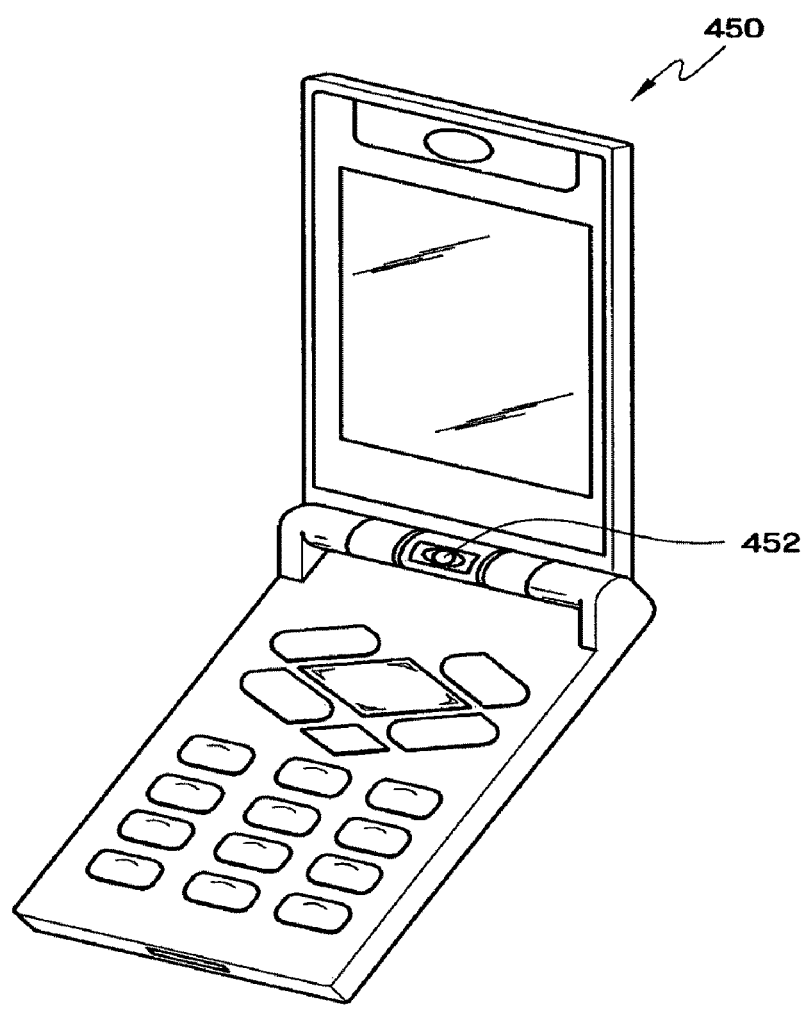
FIG. 17(b) illustrates an example mobile phone according to the ninth embodiment.

FIG. 17(a) illustrates a computer apparatus 300 including an image sensor 310 according to a ninth embodiment. The computer apparatus 300 may be used in, e.g., a mobile system such as a personal digital assistant (PDA), a portable computer, a web tablet, a video or still camera, a mobile phone, a portable media player (PMP), a web camera, an optical sensor, etc. An example mobile phone is shown in FIG. 17b, wherein an image sensor 452 according to an embodiment is incorporated in cellular phone handset 450.

Referring to FIG. 17(a), the computer apparatus may include a CPU 320, e.g., a microprocessor, which may communicate with an I/O element 330, e.g., a keypad, a keyboard, a display, a haptic device, etc., via a bus 305. The image sensor 310 may also communicate with the computer CPU 320 through the bus 305. In an implementation, the image sensor 310 may be integrated with the CPU 320, a digital signal processor (DSP), memory etc.

The computer 300 may further include memory such as RAM 340 and an external interface 360, which may each communicate with the CPU 320 via the bus 305. The external interface 360 may couple a video card, a sound card, a memory card, an IEEE 1394 or universal serial bus (USB) device, etc., to the computer apparatus 300.

Figure 18:
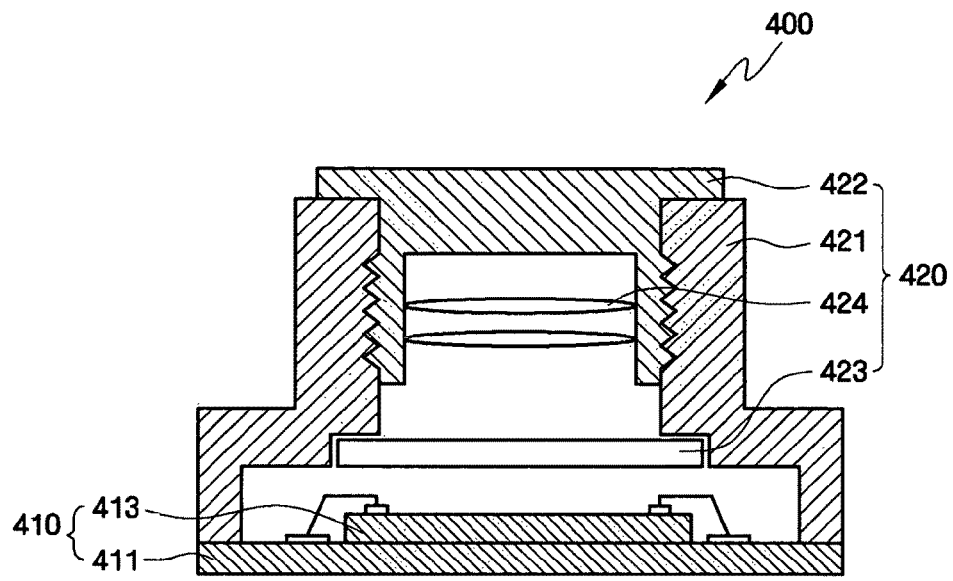
FIG. 18 illustrates a camera apparatus according to a tenth embodiment.

FIG. 18 illustrates a camera apparatus 400 according to a tenth embodiment. Referring to FIG. 18, the camera apparatus 400 may include a CMOS image sensor package 410 that includes an image sensor 413 formed according to the above-described embodiments. The image sensor 413 may be mounted on a circuit substrate 411 and may be electrically coupled thereto via bonding wires.

A housing may be attached to the substrate 411 to protect the substrate 411 and the image sensor 413. The housing may also form part of an optical system 420 that directs light to the image sensor 413. For example, the housing may have a cylinder part 421 through which light, e.g., an optical image, passes through, a protective cover 422 transmitting the light, a filter 423, e.g., for filtering out an infrared light component of the light, a lens 424, a reflection prevention film 423, etc.

Figure 19:
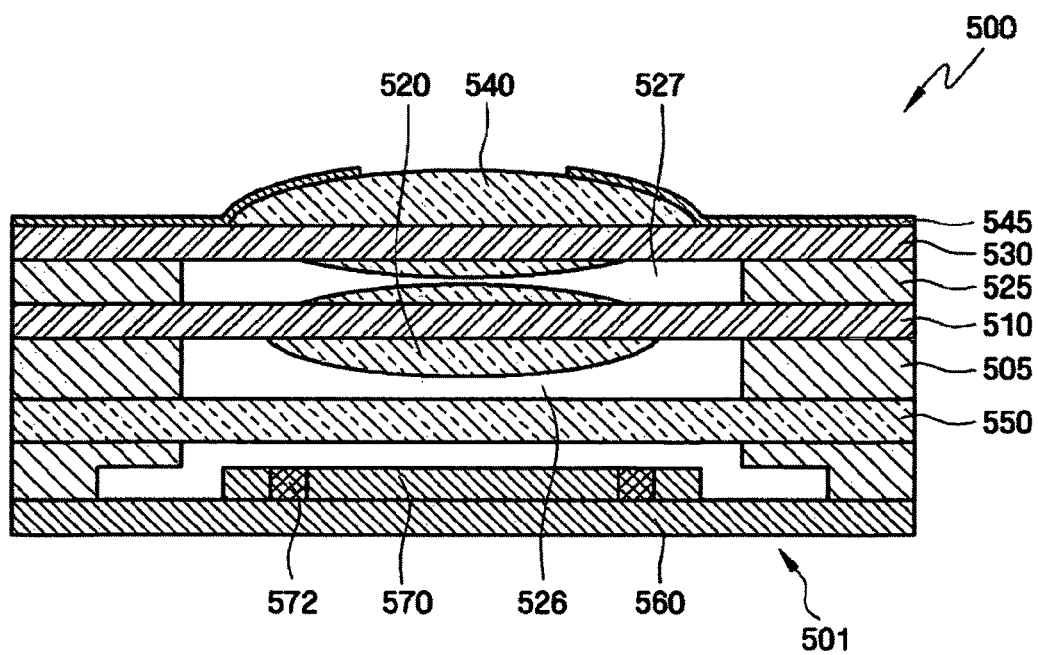
FIG. 19 illustrates a camera apparatus according to an eleventh embodiment.

FIG. 19 illustrates a camera apparatus 500 according to an eleventh embodiment. Referring to FIG. 19, the camera apparatus 500 may include an image sensor package 501, a substrate 560, e.g., a printed circuit board, and an image sensor chip 570. The image sensor chip 570 may be a CIS chip according to an embodiment. The image sensor chip 570 may be mounted to the substrate 560 and may be electrically connected there to using through-via electrodes 572.

The camera apparatus may further include, e.g., a first lens 520, a second lens 540, complementary lens components and/or air gaps 526, 527, support members 505, 525, an aperture 545, transparent substrates 510, 530, and a protective transparent member 550, e.g., a glass member, which may seal an area occupied by the image sensor chip 570.

Example embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A CMOS image sensor, comprising:
   a silicon-based substrate having a thermal oxide layer at a second surface thereof, the thermal oxide layer being integral with the substrate;
   at least one light-sensing device in the substrate; and
   a metal interconnection structure on a first surface of the substrate, the first surface being opposite the second surface, such that the at least one light sensing device is between the metal interconnection structure and the thermal oxide layer, the metal interconnection structure being electrically connected to the at least one light-sensing device.

2. The CMOS image sensor as claimed in claim 1, further comprising a refractive index matching layer containing nitrogen on the thermal oxide layer, the thermal oxide layer being between the refractive index matching layer and the at least one light sensing device.

3. The CMOS image sensor as claimed in claim 2, wherein the refractive index matching layer is a silicon nitride layer, the thermal oxide layer being between the silicon nitride layer and the at least one light-sensing device.

4. The CMOS image sensor as claimed in claim 2, wherein:
   adjacent light sensing devices are in the substrate,
   an isolation structure is between the adjacent light-sensing devices, and
   the isolation structure extends from the first surface of the substrate to a depth sufficient to block optical cross-talk between each of the adjacent light sensing devices.

5. The CMOS image sensor as claimed in claim 4, wherein:
   the isolation structure extends from the first surface of the substrate to the thermal oxide layer, and
   the isolation structure does not pass through the thermal oxide layer.

6. The CMOS image sensor as claimed in claim 4, wherein:
   the refractive index matching layer is a silicon nitride layer, and
   the isolation structure extends from the first surface and passes through the silicon nitride layer.

7. The CMOS image sensor as claimed in claim 1, further comprising a shallow implant layer in the substrate, the shallow implant layer being between the thermal oxide layer and the bulk of the substrate.

8. The CMOS image sensor as claimed in claim 7, wherein the shallow implant layer is a boron-containing layer.

9. The CMOS image sensor as claimed in claim 1, further comprising an etch stop layer on the thermal oxide layer.

10. The CMOS image sensor as claimed in claim 1, further comprising another substrate on the metal interconnection structure, such that the metal interconnection structure is between the substrate and the other substrate.

11. The CMOS image sensor as claimed in clam 10, wherein:
an adhesive layer is on the metal interconnection structure,
an opposing adhesive layer is on the other substrate, and
the adhesive layer and the opposing adhesive layer directly contact one another.

12. A method of fabricating a CMOS image sensor, the method comprising:
forming a substrate structure that includes a first substrate, a second, silicon-based substrate, and a refractive index matching layer containing nitrogen and a thermal oxide layer between the first and second substrates, the second substrate having the thermal oxide layer at a second surface thereof, the thermal oxide layer being integral with the second substrate, the thermal oxide layer being formed by thermal oxidation of the second surface of the second substrate opposite a first surface;
forming at least one light-sensing device in the second substrate; and
after forming the substrate structure, forming a metal interconnection structure on the first surface of the second substrate, the first surface facing away from the first substrate, such that the at least one light sensing device is between the metal interconnection structure and the refractive index matching layer and the thermal oxide layer, the metal interconnection structure being electrically connected to the at least one light-sensing device.

13. The method as claimed in claim 12, wherein:
the thermal oxide layer is formed between the refractive index matching layer and the second substrate.

14. The method as claimed in claim 13, further comprising forming a shallow implant layer in the second substrate, such that the shallow implant layer is between the bulk of the second substrate and the thermal oxide layer.

15. The method as claimed in claim 14, wherein forming the shallow implant layer includes implanting ions of a p-type dopant into the second substrate and thermally activating the implanted ions.

16. The method as claimed in claim 13, wherein:
the refractive index matching layer is formed from a silicon nitride layer, and
forming the substrate structure further includes forming a bonding oxide layer on the silicon nitride layer, the bonding oxide layer contacting the first substrate.

17. The method as claimed in claim 16, wherein forming the substrate structure further includes, after bonding the first and second substrates together and before forming the at least one light-sensing device, removing a portion of the second substrate so as to thin the second substrate by about 50% or more.

18. The method as claimed in claim 16, wherein forming the substrate structure further includes:
forming a microcavity layer in the second substrate at a predetermined distance from the thermal oxide layer before bonding the first and second substrates together,
bonding the first and second substrates together, and
removing a portion of the second substrate to a depth of the microcavity layer.

19. The method as claimed in claim 18, further comprising, after removing the portion of the second substrate to the depth of the microcavity layer, forming an epitaxial layer on the second substrate, wherein the at least one light sensing device is formed after forming the epitaxial layer.

20. The method as claimed in claim 18, wherein forming the substrate structure further includes forming a shallow implant layer in the second substrate after forming the thermal oxide layer and the microcavity layer, the shallow implant layer being formed between the thermal oxide layer and the microcavity layer.

21. The method as claimed in claim 13, wherein the refractive index matching layer is formed from a silicon nitride layer.

22. The method as claimed in claim 21, wherein the thermal oxide layer and the refractive index matching layer form an antireflective layer.

23. The method as claimed in claim 13, further comprising:
forming adjacent light sensing devices in the second substrate; and
forming an isolation layer between the adjacent light sensing devices, wherein the isolation layer is formed to extend from the first surface of the second substrate to a depth sufficient to block optical cross-talk between each of the adjacent light sensing devices.

24. The method as claimed in claim 12, further comprising, after forming the metal interconnection structure, reducing a thickness of the first substrate by about 50% or more.

25. The method as claimed in claim 24, wherein forming the substrate structure includes forming an etch stop layer between the first substrate and the refractive index matching layer.

26. The method as claimed in claim 24, further comprising bonding a third substrate to the first surface of the second substrate after forming the metal interconnection structure and before reducing the thickness of the first substrate by about 50% or more.

27. A method of fabricating a CMOS image sensor, the method comprising:
forming a thermal oxide layer at a second surface of a silicon-based substrate, the thermal oxide layer being integral with the substrate;
forming at least one light-sensing device in the substrate; and
forming a metal interconnection structure on a first surface of the substrate, the first surface being opposite the second surface, such that the at least one light sensing device is between the metal interconnection structure and the thermal oxide layer, the metal interconnection structure being electrically connected to the at least one light-sensing device.

* * * * *